(12) United States Patent
Lin

(10) Patent No.: US 11,764,179 B2
(45) Date of Patent: Sep. 19, 2023

(54) SEMICONDUCTOR DEVICE PACKAGE

(71) Applicant: Advanced Semiconductor Engineering, Inc., Kaohsiung (TW)

(72) Inventor: Zhi-Yuan Lin, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/994,483

(22) Filed: Aug. 14, 2020

(65) Prior Publication Data
US 2022/0052004 A1 Feb. 17, 2022

(51) Int. Cl.
H01L 21/56 (2006.01)
H01L 23/498 (2006.01)
H01L 23/00 (2006.01)
H01L 23/31 (2006.01)
H01L 21/768 (2006.01)

(52) U.S. Cl.
CPC .............. *H01L 24/14* (2013.01); *H01L 21/56* (2013.01); *H01L 21/563* (2013.01); *H01L 21/76877* (2013.01); *H01L 23/31* (2013.01); *H01L 23/498* (2013.01); *H01L 23/49816* (2013.01)

(58) Field of Classification Search
CPC ............. H01L 23/498; H01L 23/49833; H01L 23/49816; H01L 21/56; H01L 21/563
See application file for complete search history.

(56) References Cited

U.S. PATENT DOCUMENTS

| | | | |
|---|---|---|---|
| 2010/0327419 A1* | 12/2010 | Muthukumar | H01L 23/49827 257/686 |
| 2014/0126159 A1 | 5/2014 | Lin et al. | |
| 2017/0133351 A1* | 5/2017 | Su | H01L 21/6835 |
| 2017/0229322 A1* | 8/2017 | Hsu | H01L 21/565 |
| 2019/0109117 A1* | 4/2019 | Fang | H01L 21/6835 |
| 2019/0229046 A1* | 7/2019 | Tsai | H01L 21/568 |
| 2019/0371781 A1* | 12/2019 | Huang | H01L 24/09 |
| 2020/0006214 A1* | 1/2020 | Tsai | H01L 21/486 |
| 2020/0027837 A1* | 1/2020 | Jeng | H01L 23/5389 |
| 2020/0135653 A1* | 4/2020 | Tsai | H01L 21/6835 |
| 2020/0176347 A1* | 6/2020 | Costa | H01L 23/36 |
| 2020/0411445 A1* | 12/2020 | Chen | H01L 24/19 |
| 2021/0183647 A1* | 6/2021 | Hanft | H01L 21/76829 |

* cited by examiner

*Primary Examiner* — Phat X Cao
(74) *Attorney, Agent, or Firm* — FOLEY & LARDNER LLP

(57) ABSTRACT

The present disclosure provides a semiconductor device package. The semiconductor device package includes a conductive pillar having a first surface, a second surface, and a lateral surface extending between the first surface and the second surface. The lateral surface has a first part and a second part connected to the first part. The semiconductor device package also includes a barrier layer in contact with the first part of the lateral surface of the conductive pillar and an encapsulant in contact with the second part of the lateral surface of the conductive pillar. The semiconductor device package also includes a first flowable conductive material disposed on the first surface of the conductive pillar. A method of manufacturing a semiconductor device package is also disclosed.

6 Claims, 23 Drawing Sheets

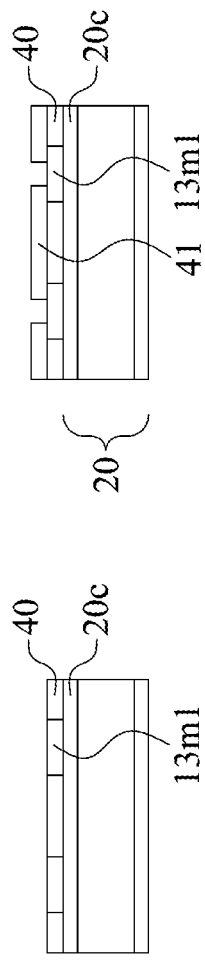
FIG. 4A
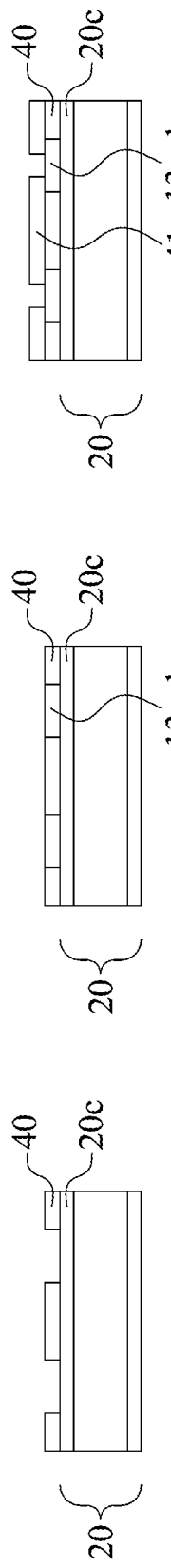
FIG. 4B
FIG. 4C
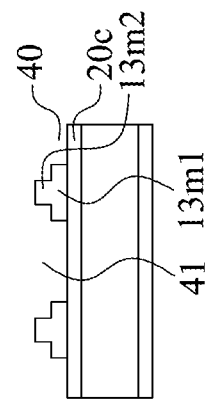
FIG. 4D
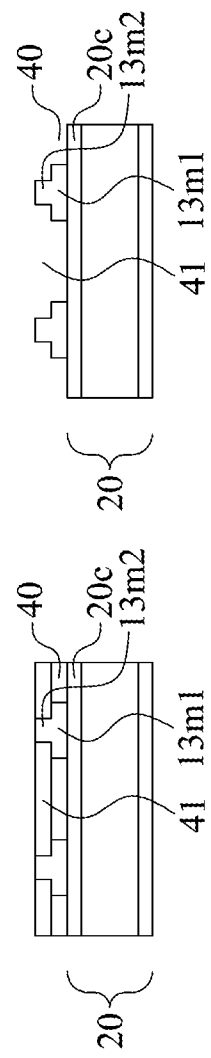
FIG. 4E

SEMICONDUCTOR DEVICE PACKAGE

BACKGROUND

1. Technical Field

The present disclosure generally relates to a semiconductor device package and a method of manufacturing the same, and to a semiconductor device package including conductive pillars and conductive pads.

2. Description of the Related Art

In existing semiconductor structures, conductive elements are commonly attached or bonded to pads on a substrate through connection elements (e.g., solder). The connection elements may flow away from the pads during reflow, resulting in an uneven joint height and causing the conductive elements to tilt.

SUMMARY

In one or more embodiments, a semiconductor device package includes a conductive pillar having a first surface, a second surface, and a lateral surface extending between the first surface and the second surface. The lateral surface has a first part and a second part connected to the first part. The semiconductor device package also includes a barrier layer in contact with the first part of the lateral surface of the conductive pillar and an encapsulant in contact with the second part of the lateral surface of the conductive pillar. The semiconductor device package also includes a first flowable conductive material disposed on the first surface of the conductive pillar.

In one or more embodiments, a semiconductor device package includes a conductive pillar including a first part and a second part. The semiconductor device package also includes a first encapsulant surrounding the first part of the conductive pillar and a second encapsulant surrounding the second part of the conductive pillar. The first part of the conductive pillar is spaced apart from the first encapsulant by a first gap, the second part of the conductive pillar is spaced apart from the second encapsulant by a second gap, and the second gap is greater than the first gap.

In one or more embodiments, a method for manufacturing a semiconductor device package includes providing a conductive pillar having a lateral surface, the lateral surface having a first part, a second part connected to the first part, and a third part connected to the second part. The first part is covered by a barrier. The method also includes disposing an encapsulant to surround the second part of the conductive pillar and form a gap between the encapsulant and the second part of the conductive pillar. The method also includes providing a flowable conductive material to cover the third part and flowing the flowable conductive material.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

FIG. 4A illustrates one or more stages of a method of manufacturing a semiconductor device package in accordance with some embodiments of the present disclosure.

FIG. 4B illustrates one or more stages of a method of manufacturing a semiconductor device package in accordance with some embodiments of the present disclosure.

FIG. 4C illustrates one or more stages of a method of manufacturing a semiconductor device package in accordance with some embodiments of the present disclosure.

FIG. 4D illustrates one or more stages of a method of manufacturing a semiconductor device package in accordance with some embodiments of the present disclosure.

FIG. 4E illustrates one or more stages of a method of manufacturing a semiconductor device package in accordance with some embodiments of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
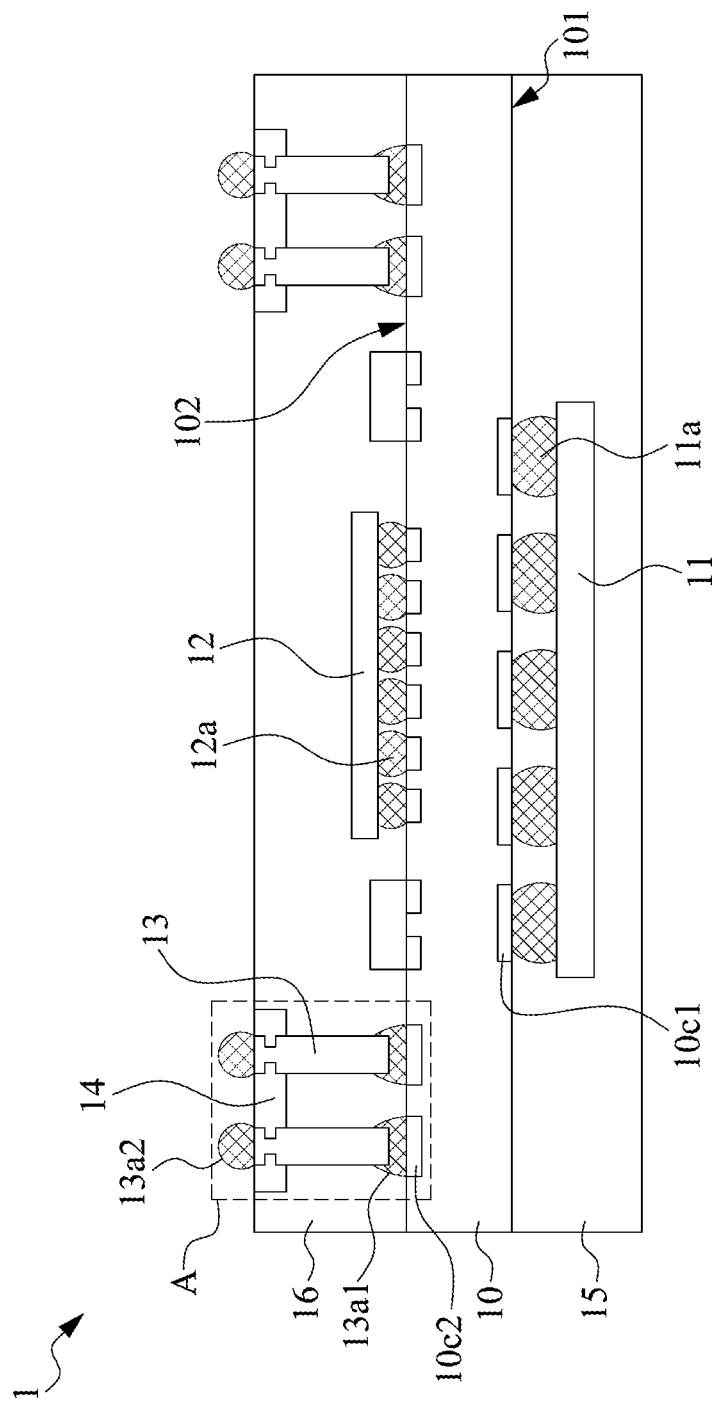
FIG. 1A illustrates a cross-sectional view of a semiconductor device package in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity, and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1A illustrates a cross-sectional view of a semiconductor device package 1 in accordance with some embodiments of the present disclosure. The semiconductor device package 1 includes a substrate 10, electronic components 11 and 12, a conductive pillar 13, a barrier layer 14, and encapsulants 15 and 16.

The substrate 10 has a surface 101 and a surface 102 opposite the surface 101. The substrate 10 may include, for example, but is not limited to, a printed circuit board, such as a paper-based copper foil laminate, a composite copper foil laminate, or a polymer-impregnated glass-fiber-based copper foil laminate. The substrate 10 may include an interconnection structure, such as a redistribution layer (RDL) or a grounding element.

The substrate 10 may include one or more conductive pads 10c1 in proximity to, adjacent to, or embedded in and exposed at the surface 101 of the substrate 10. The substrate 10 may include a solder resist (not shown) on the surface 101 of the substrate 10 to fully expose or to expose at least a portion of the conductive pads 10c1 for electrical connections. Similarly, the substrate 10 may include one or more conductive pads 10c2 in proximity to, adjacent to, or embedded in and exposed at the surface 102 of the substrate 10. The substrate 10 may include a solder resist (not shown) on the surface 102 of the substrate 10 to fully expose or to expose at least a portion of the conductive pads 10c2 for electrical connections.

The electronic component 11 is disposed on the surface 101 of the substrate 10 and electrically connected to the conductive pads 10c1 through an electrical contact 11a. The electrical contact 11a is disposed on the conductive pads 10c1. In some embodiments, the electrical contact 11a may include a controlled collapse chip connection (C4) bump, a ball grid array (BGA), or a land grid array (LGA). In some embodiments, the electrical contact 11a may include a flowable conductive material. In some embodiments, the electrical contact 11a may include, for example, eutectic Sn/Pb, high-lead solder, lead-free solder, pure tin solder, or other types of solders.

The electronic component 11 may be a chip or a die including a semiconductor substrate, one or more integrated circuit devices and one or more overlying interconnection structures therein. The integrated circuit devices may include active devices such as transistors and/or passive devices such as resistors, capacitors, inductors, or a combination thereof.

The encapsulant 15 is disposed on the surface 101 of the substrate 10. The encapsulant 15 covers or encapsulates the electronic component 11. The encapsulant 15 may include, for example, but is not limited to, one or more organic materials (e.g., a molding compound, bismaleimide triazine (BT), a polyimide (PI), a polybenzoxazole (PBO), a solder resist, an Ajinomoto build-up film (ABF), a polypropylene (PP), an epoxy-based material, or a combination of two or more thereof), inorganic materials (e.g., silicon, a glass, a ceramic, a quartz, or a combination of two or more thereof), liquid-film material(s) or dry-film material(s), or a combination of two or more thereof.

Similarly, the electronic component 12 is disposed on the surface 102 of the substrate 10 and electrically connected to the conductive pads 10c2 through an electrical contact 12a. The encapsulant 16 is disposed on the surface 102 of the substrate 10. The encapsulant 16 covers or encapsulates the electronic component 12.

The detailed descriptions of the electronic component 12, the electrical contact 12a, and the encapsulant 16 may be respectively referred to the electronic component 11, the electrical contact 11a, and the encapsulant 15 stated above and thus, they would not be repeated herein.

The conductive pillar 13 is disposed on the surface 102 of the substrate 10 and spaced apart from the electronic component 12. The conductive pillar 13 is electrically connected to the conductive pads 10c2 through an electrical contact 13a1. Another electrical contact (i.e., an electrical contact 13a2) is disposed on a side on the conductive pillar 13 opposite to the electrical contact 13a1 to provide electrical connections for the semiconductor package structure 1 with an external component (such as an electronic component or a substrate). The conductive pillar 13 may include, for example, but is not limited to, gold (Au), silver (Ag), copper (Cu), nickel (Ni), palladium (Pd), another metal, a solder alloy, or a combination of two or more thereof.

The barrier layer 14 surrounds a part of a surface (such as a lateral surface) of the conductive pillar 13. The barrier layer 14 is disposed in proximity to, adjacent to, or embedded in the encapsulant 16. The barrier 14 is exposed from a surface 162 of the encapsulant 16 facing away from the substrate 10. A portion of the barrier 14 (e.g., a lateral surface and a bottom surface) is in contact with the encapsulant 16. In some embodiments, the barrier layer 14 on the left side and the barrier layer 14 on the right side are connected with each other through the other portions of the barrier layer 14.

In some embodiments, the barrier layer 14 may include a material as stated above with respect to the encapsulant 15. In some embodiments, the barrier layer 14 and the encapsulant 15 may include the same material. In some embodiments, the barrier layer 14 and the encapsulant 16 may include the same material. Alternatively, the barrier 14 and the encapsulants 15, 16 may include different materials. In some embodiments, the barrier layer 14 may include a photoresist, such as a positive photoresist or a negative photoresist.

Figure 1B:
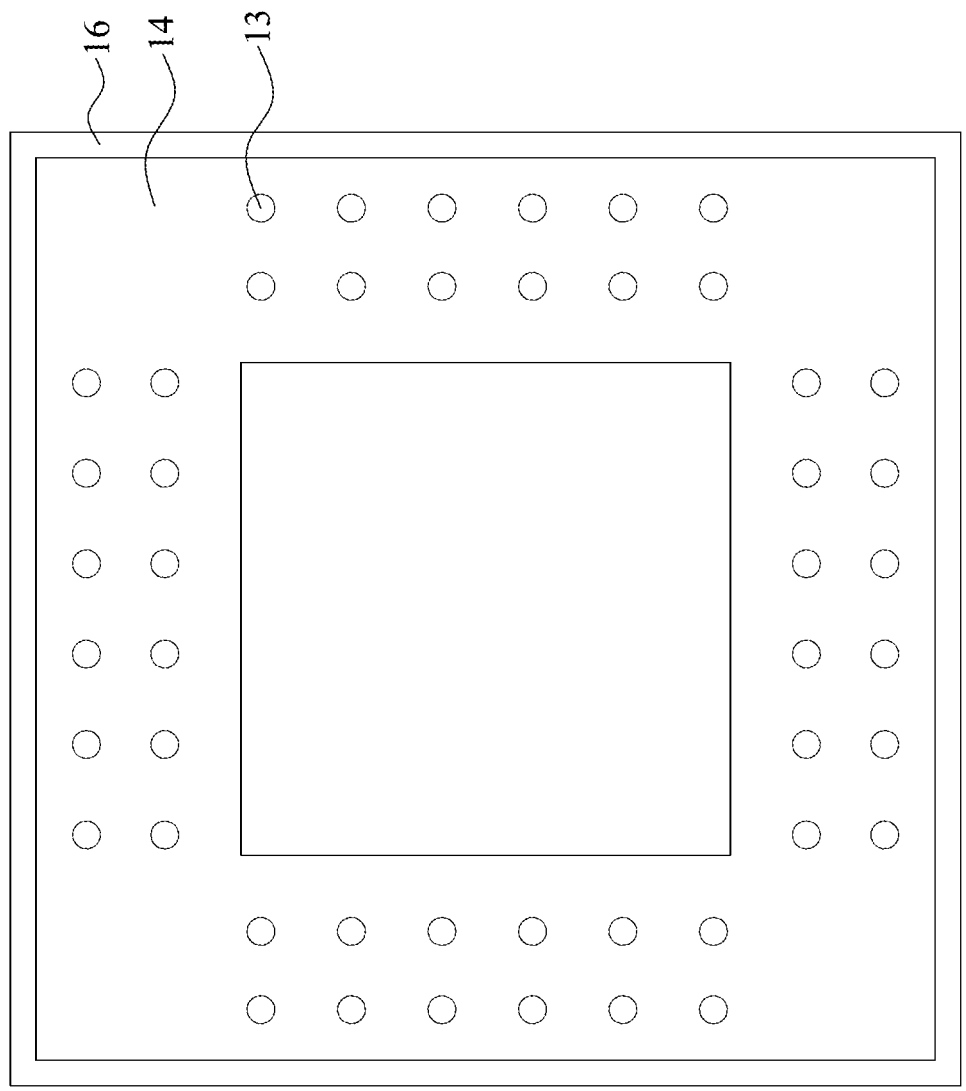
FIG. 1B illustrates a top view of a semiconductor device package in accordance with some embodiments of the present disclosure.

Referring to FIG. 1B, FIG. 1B illustrates a top view of a semiconductor device package in accordance with some embodiments of the present disclosure. In some embodiments, the top view of FIG. 1B may be a top view of the semiconductor package structure 1 in FIG. 1A. The electrical contact 13a2 is omitted in the top view of FIG. 1B for clarity and conciseness.

As shown in FIG. 1B, the conductive pillar 13 is surrounded by the barrier layer 14, and the barrier layer 14 is surrounded by the encapsulant 16. The conductive pillar 13 is in contact with the barrier layer 14, and the barrier layer 14 is in contact with the encapsulant 16. In some embodiments, a plurality of the conductive pillars 13 are surrounded by the barrier layer 14 and disposed on a periphery portion of a substrate (such as the substrate 10 in FIG. 1A). For example, the barrier layer 14 overlaps the periphery portion of the substrate. For example, the barrier layer 14 is far away from the central portion of the substrate.

Although FIG. 1B shows that the barrier layer 14 is a single piece, the present disclosure is not limited thereto. In some embodiments, there may be any number of separate barrier layers surrounding each of the conductive pillars depending on product specifications.

Figure 1C:
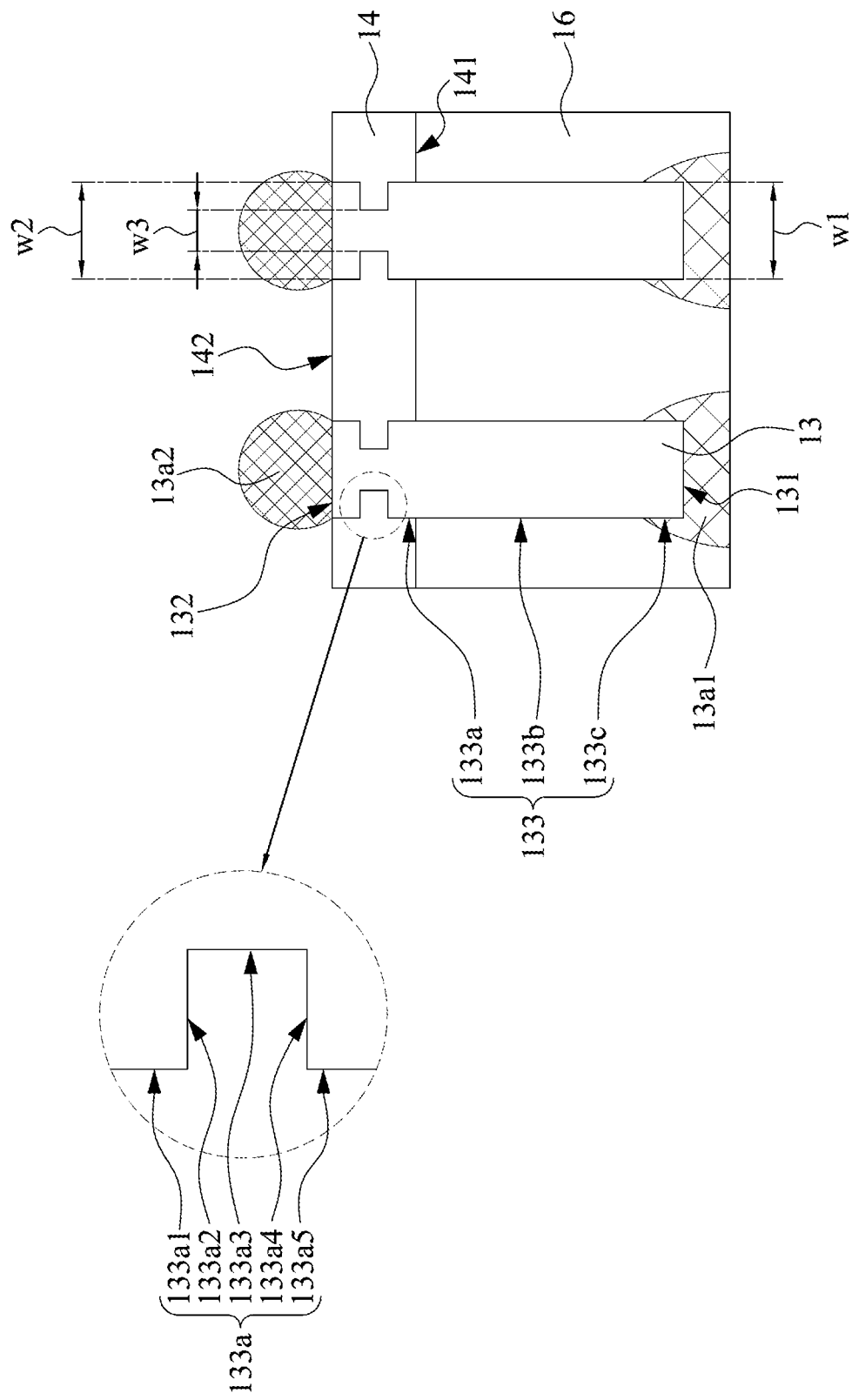
FIG. 1C illustrates an enlarged view of a portion in a dotted box A as shown in FIG. 1A in accordance with some embodiments of the present disclosure.

FIG. 1C illustrates an enlarged view of a portion of the semiconductor device package 1 encircled by a dotted box A as shown in FIG. 1A in accordance with some embodiments of the present disclosure.

The conductive pillar 13 has a surface 131, a surface 132 opposite to the surface 131, and a surface 133 (which can also be referred to as a lateral surface) extending between the surface 131 and the surface 132.

The surface 131 is embedded or encapsulated in the electrical contact 13a1. The surface 131 is in contact with the electrical contact 13a1. The electrical contact 13a1 is disposed on the surface 131 of the conductive pillar 13. The electrical contact 13a1 may protrude from the surface 131 of the conductive pillar 13 and flow onto the surface 133 of the conductive pillar 13. The electrical contact 13a1 may surround the surface 133 of the conductive pillar 13.

The barrier layer 14 has a surface 141 in contact with the encapsulant 16 and a surface 142 opposite to the surface 141. The surface 132 is exposed from the surface 142 of the barrier layer 14. In some embodiments, the surface 132 of the conductive pillar 13 is substantially coplanar with the surface 142 of the barrier layer 14. In some embodiments, the surface 132 of the conductive pillar 13 is substantially coplanar with the surface 162 of the encapsulant 16 as illustrated in FIG. 1A. The electrical contact 13a2 is disposed on the surface 132 of the conductive pillar 13.

The surface 133 has a portion 133a, a portion 133b connected with the portion 133a, and a portion 133c connected with the portion 133b. The portion 133b is connected between the portion 133a and the portion 133c. The portion 133a is surrounded by the barrier layer 14 and in contact with the barrier layer 14. The portion 133b is surrounded by the encapsulant 16 and in contact with the encapsulant 16. The portion 133c is surrounded by the electrical contact 13a1 and in contact with the electrical contact 13a1.

Referring to the enlarged view of a portion in a dotted circle as shown in FIG. 1C, the portion 133a may further include surfaces 133a1, 133a2, 133a3, 133a4 and 133a5. The surfaces 133a1, 133a3 and 133a5 are nonplanar. For example, the surfaces 133a1, 133a3 and 133a5 are discontinuous. The surface 133a1 is connected with the surface 133a3 by the surface 133a2. The surface 133a3 is connected with the surface 133a5 by the surface 133a4. The surfaces 133a1, 133a2 and 133a3 may define a step structure. The surfaces 133a3, 133a4 and 133a5 may define a step structure. The surfaces 133a2, 133a3 and 133a4 may define a recess portion. For example, the surface 133a3 is recessed from the surface 133a1 and the surface 133a5.

The lateral surface 133a1 extends between the surface 133a2 and the surface 132. The surface 133a2 is opposite to the surface 132. The lateral surface 133a3 extends between the surface 133a2 and the surface 133a4. The surface 133a4 is opposite to the surface 131.

In some embodiments, the barrier layer 14 is in contact with the lateral surface 133a1. In some embodiments, the barrier layer 14 is in contact with the surface 133a2. In some embodiments, the barrier layer 14 is in contact with the lateral surface 133a3. In some embodiments, the barrier layer 14 is in contact with the surface 133a4. In some embodiments, the barrier layer 14 is in contact with the lateral surface 133a5. In some embodiments, the barrier layer 14 encapsulates or covers the step structure defined by the lateral surface 133a1 and the surface 133a2. In some embodiments, the barrier layer 14 is accommodated in the recessing portion defined by the surface 133a2, the surface 133a4, and the lateral surface 133a3. In some embodiments, the barrier layer 14 encapsulates or covers the step structure defined by the surface 133a4 and the lateral surface 133a5.

In some embodiments, the electrical contact 13a1 may be isolated from the surface 132 of the conductive pillar 13. In some embodiments, the electrical contact 13a1 may be isolated from the lateral surface 133a1. In some embodiments, the electrical contact 13a1 may be isolated from the surface 133a2. In some embodiments, the electrical contact 13a1 may be isolated from the lateral surface 133a3. In some embodiments, the electrical contact 13a1 may be isolated from the surface 133a4. In some embodiments, the electrical contact 13a1 may be isolated from the lateral surface 133a5.

In some embodiments, the electrical contact 13a1 may be in contact with the lateral surface 133a5 and isolated from the surface 133a4. In some embodiments, the electrical contact 13a1 may be in contact with the surface 133a4 and isolated from the lateral surface 133a3. In some embodiments, the electrical contact 13a1 may be in contact with the lateral surface 133a3 and isolated from the surface 133a2. In some embodiments, the electrical contact 13a1 may be in contact with the surface 133a2 and isolated from the lateral surface 133a1. In some embodiments, the electrical contact 13a1 may be in contact with the lateral surface 133a1 and isolated from the surface 132.

In some embodiments, a width of the surface 131 of the conductive pillar 13 is different from a width of the surface 132 of the conductive pillar 13. For example, a width (denoted as "w1" in FIG. 1C) of the surface 131 is greater than a width (denoted as "w2" in FIG. 1C) of the surface 132. In some embodiments, the width w2 of the surface 132 is greater than the width w1 of the surface 131. In some embodiments, a width of the recessing portion (denoted as "w3" in FIG. 1C) is the smallest width of the conductive pillar 13. For example, the width w3 is less than the width w1 and the width w2.

Figure 1D:
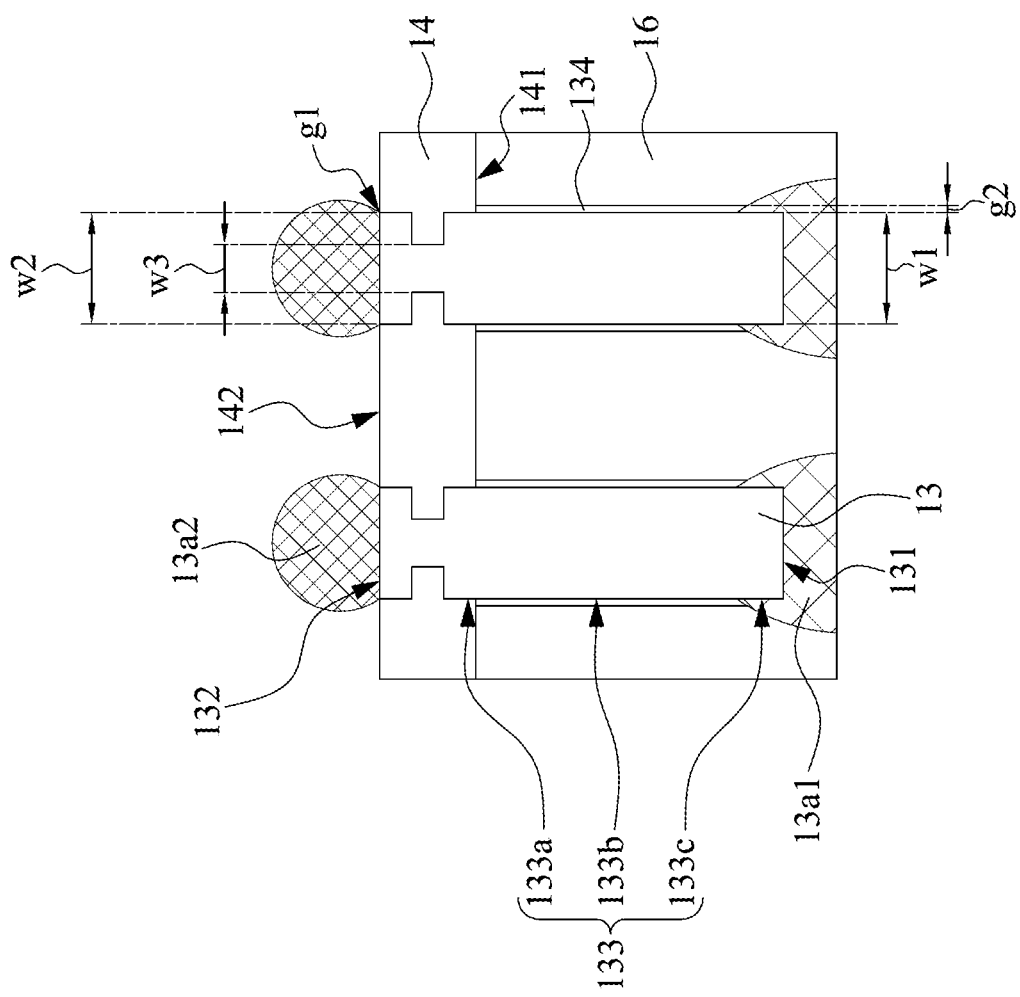
FIG. 1D illustrates an enlarged view of a portion of a semiconductor device package in accordance with some embodiments of the present disclosure.

Referring to FIG. 1D, FIG. 1D illustrates an enlarged view of a portion of a semiconductor device package in accordance with some embodiments of the present disclosure. In some embodiments, the portion in the dotted box A as shown in FIG. 1A can be replaced with the portion illustrated in FIG. 1D. The portion illustrated in FIG. 1D is similar to the portion illustrated in FIG. 1C, and the differences therebetween are described below.

An oxidation layer 134 may be formed on the surface 133 of the conductive pillar 13. For example, the portion 133b of the surface 133 of the conductive pillar 13 may be surrounded by the oxidation layer 134. For example, the portion 133b of the surface 133 of the conductive pillar 13 may be in contact with the oxidation layer 134. In some embodiments, the oxidation layer 134 may form on surfaces of the conductive pillar 13 that exposing from the barrier layer 14 and the electrical contact 13a1 (such as in an operation before disposing the encapsulant 16 as illustrated in FIG. 5D). In some embodiments, at least a part of the portion 133b of the surface 133 of the conductive pillar 13 may be isolated from the encapsulant 16 by the oxidation layer 134. For example, a gap g2 may exist between the portion 133b of the surface 133 of the conductive pillar 13 and the encapsulant 16. In some embodiments, the gap g1 may be greater than zero.

In some embodiments, an oxidation layer (not illustrated in the figures) may also be formed on the portion 133a of the surface 133 of the conductive pillar 13. For example, the portion 133a of the surface 133 of the conductive pillar 13 may be surrounded by an oxidation layer. For example, the portion 133a of the surface 133 of the conductive pillar 13 may be in contact with an oxidation layer. In some embodiments, at least a part of the portion 133a of the surface 133 of the conductive pillar 13 may be isolated from the barrier layer 14 by an oxidation layer. For example, a gap g1 may exist between the portion 133a of the surface 133 of the conductive pillar 13 and the barrier layer 14. In some embodiments, the gap g1 may be zero. For example, the portion 133a may be fully surrounded by the barrier layer 14. In some embodiments, the gap g2 may be greater than the gap g1. In some embodiments, the thickness of the oxidation layer 134 may be greater than the thickness of the oxidation layer (if exist) on the portion 133a.

In some embodiments, the adhesion between the conductive pillar 13 and the encapsulant 16 is greater than the adhesion between the oxidation layer 134 and the encapsulant 16. Due to the formation of the oxidation layer 134, the encapsulant 16 may delaminate from the conductive pillar 13, the gap g2 may expand and the electrical contact 13a1 may flow on the oxidation layer 134 through the gap g2.

Figure 1E:
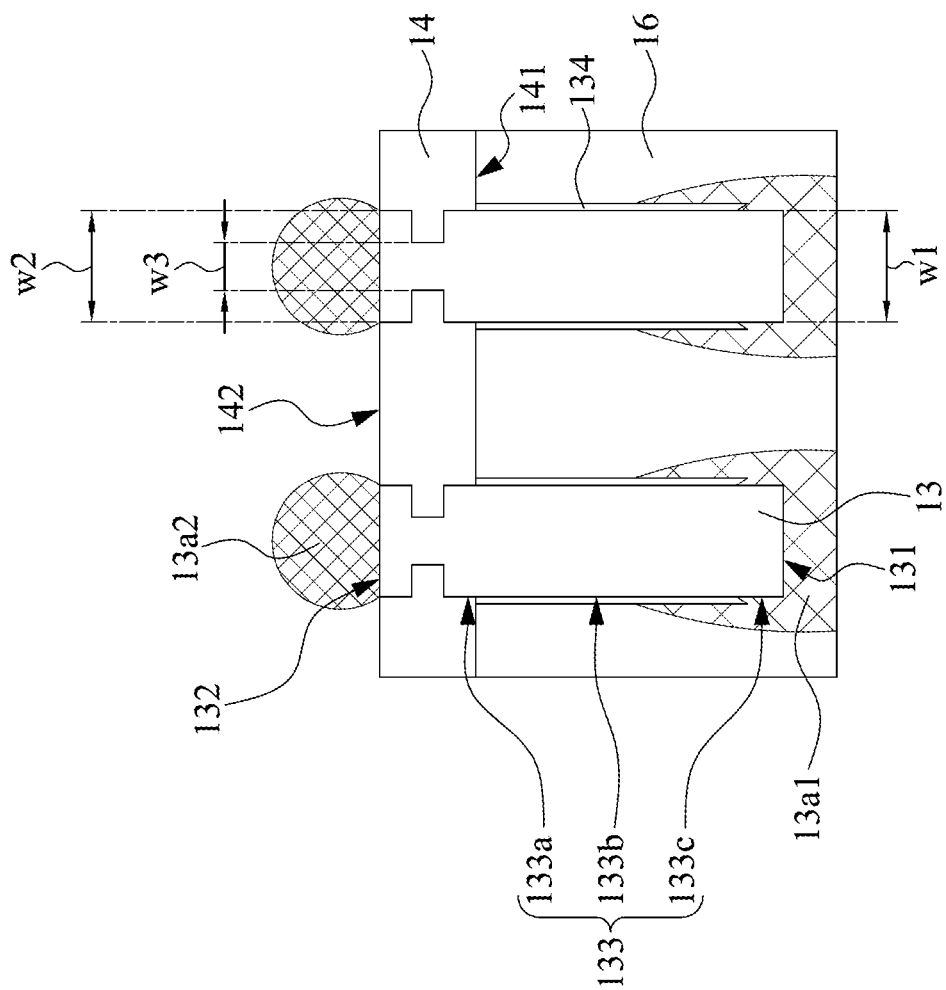
FIG. 1E illustrates an enlarged view of a portion of a semiconductor device package in accordance with some embodiments of the present disclosure.

For example, referring to FIG. 1E, FIG. 1E illustrates an enlarged view of a portion of a semiconductor device package in accordance with some embodiments of the present disclosure. In some embodiments, the portion in the dotted box A as shown in FIG. 1A can be replaced with the portion illustrated in FIG. 1E. The portion illustrated in FIG. 1E is similar to the portion illustrated in FIG. 1D, and the differences therebetween are described below.

A part of the electrical contact 13a1 flows on the oxidation layer 134. A part of the oxidation layer 134 may be covered by the electrical contact 13a1. A part of the portion 133b may be covered by the oxidation layer 134 and the electrical contact 13a1.

Figure 1F:
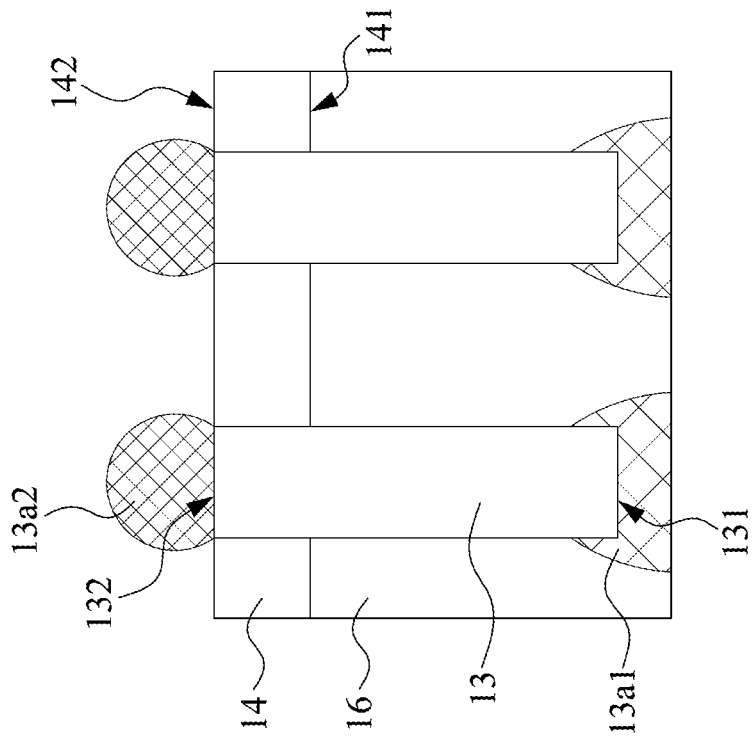
FIG. 1F illustrates an enlarged view of a portion of a semiconductor device package in accordance with some embodiments of the present disclosure.

Referring to FIG. 1F, FIG. 1F illustrates an enlarged view of a portion of a semiconductor device package in accordance with some embodiments of the present disclosure. In some embodiments, the portion in the dotted box A as shown in FIG. 1A can be replaced with the portion illustrated in FIG. 1F. The portion illustrated in FIG. 1F is similar to the portion illustrated in FIG. 1C, and the differences therebetween are described below.

The conductive pillar 13 in FIG. 1F is exclusive of the lateral surface 133a1 and the surface 133a2 in FIG. 1C. The width w1 of the surface 131 is greater than the width w3 of the surface 132. In some embodiments, the width w3 of the surface 132 is the smallest width of the conductive pillar 13.

Figure 1G:
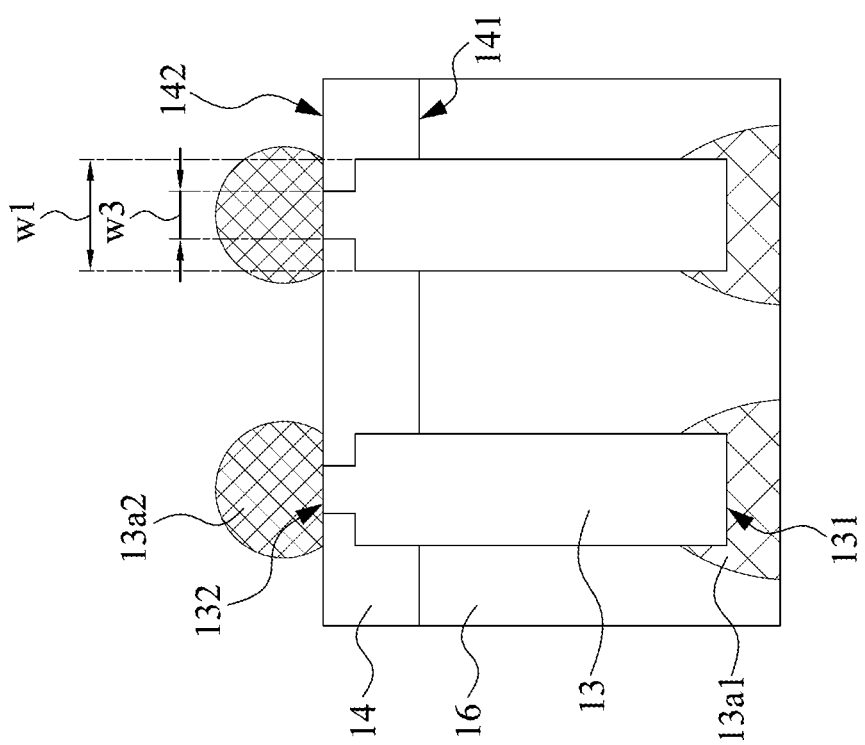
FIG. 1G illustrates an enlarged view of a portion of a semiconductor device package in accordance with some embodiments of the present disclosure.

Referring to FIG. 1G, FIG. 1G illustrates an enlarged view of a portion of a semiconductor device package in accordance with some embodiments of the present disclosure. In some embodiments, the portion in the dotted box A as shown in FIG. 1A can be replaced with the portion illustrated in FIG. 1G. The portion illustrated in FIG. 1G is similar to the portion illustrated in FIG. 1C, and the differences therebetween are described below.

The conductive pillar 13 in FIG. 1G is exclusive of the lateral surface 133a1, the surface 133a2, the lateral surface 133a3, and the surface 133a4 in FIG. 1C. In some embodiments, the width of the conductive pillar 13 is consistent throughout the length between the surface 131 and the surface 132.

In some comparative embodiments, the barrier layer 14 of the semiconductor device package 1 may be omitted, with the conductive pillar 13 surrounded only by the encapsulant 16. As mentioned, the electrical contact 13a1 disposed on the surface 131 of the conductive pillar 13 may include a flowable conductive material. Thus, during a high-temperature process (e.g., a reflow operation), the electrical contact 13a1 would be melted and may flow away from the surface 131 toward the surface 132 through the surface 133 of the conductive pillar 13 via the gap (such as the gap g2 in FIG. 1D) between the conductive pillar 13 and the encapsulant 16. In some cases, the electrical contact 13a1 may be jointed with the electrical contact 13a2. The amount of the electrical contact 13a1 flowing away from the surface 131 may be uncontrolled, resulting in uneven joint height and tilting of the conductive pillar 13. In addition, the electrical contact 13a1 flowing away from the surface 131 may also cause problems such as non-wetting or insufficient solder. This would adversely affect the electrical performance of the semiconductor device package.

In accordance with the embodiments as shown in FIGS. 1A-1G, at least a portion of the conductive pillar 13 is surrounded by the barrier layer 14, the electrical contact 13a1 flowing onto the surface 133 can be confined to a preferred height, that is, the amount flowing away can be controlled to an acceptable value. In addition, it can prevent the electrical contact 13a1 from being in contact with the surface 132 of the conductive pillar 13 and/or jointed with the electrical contact 13a2. Furthermore, the barrier layer 14 can provide a locking force to the conductive pillar 13. In such a way, the stated problems can be solved, which can enhance the reliability of the semiconductor device package 1.

Figure 2A:
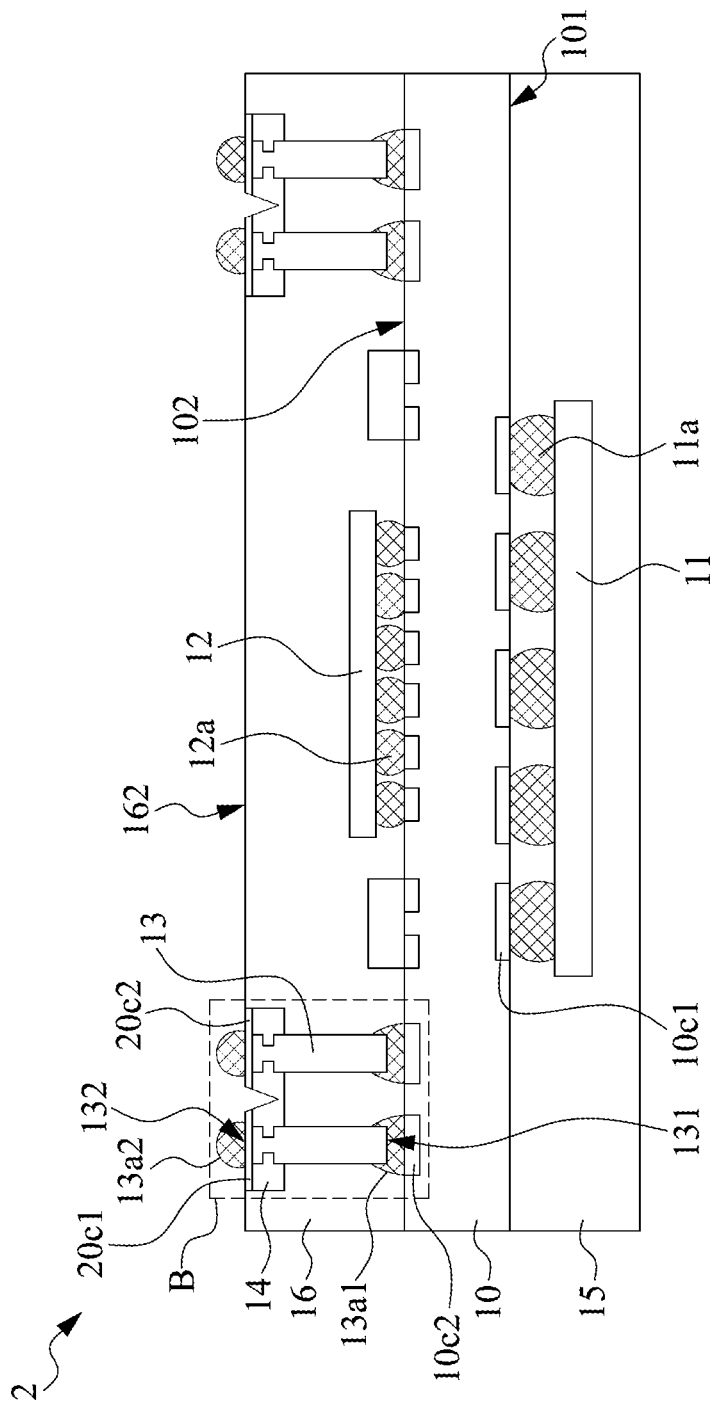
FIG. 2A illustrates a cross-sectional view of a semiconductor device package in accordance with some embodiments of the present disclosure.

FIG. 2A illustrates a cross-sectional view of a semiconductor device package 2 in accordance with some embodiments of the present disclosure. The semiconductor device package 2A is similar to the semiconductor device package 1 in FIG. 1A, and the differences therebetween are described below.

The semiconductor device package 2 includes a seed layer 20c1 and a seed layer 20c2. Each of the seed layer 20c1 and the seed layer 20c2 is disposed in proximity to, adjacent to, or embedded in the encapsulant 16. Each of the seed layer 20c1 and the seed layer 20c2 is exposed from a surface of the encapsulant 16 facing away from the substrate 10. A portion of each of the seed layer 20c1 and the seed layer 20c2 (e.g., a lateral surface) is in contact with the encapsulant 16. A portion of each of the seed layer 20c1 and the seed layer 20c2 (e.g., a bottom surface) is in contact with the barrier 14. Each of the seed layer 20c1 and the seed layer 20c2 has a surface substantially coplanar with the surface 162 of the encapsulant 16. Each of the seed layer 20c1 and the seed layer 20c2 is disposed on the barrier layer 14 and the surface 132 of the conductive pillar 13. Each of the seed layer 20c1 and the seed layer 20c2 covers the surface 132 of the conductive pillar 13. The electrical contact 13a2 is disposed on each of the seed layer 20c1 and the seed layer 20c2.

Figure 2B:
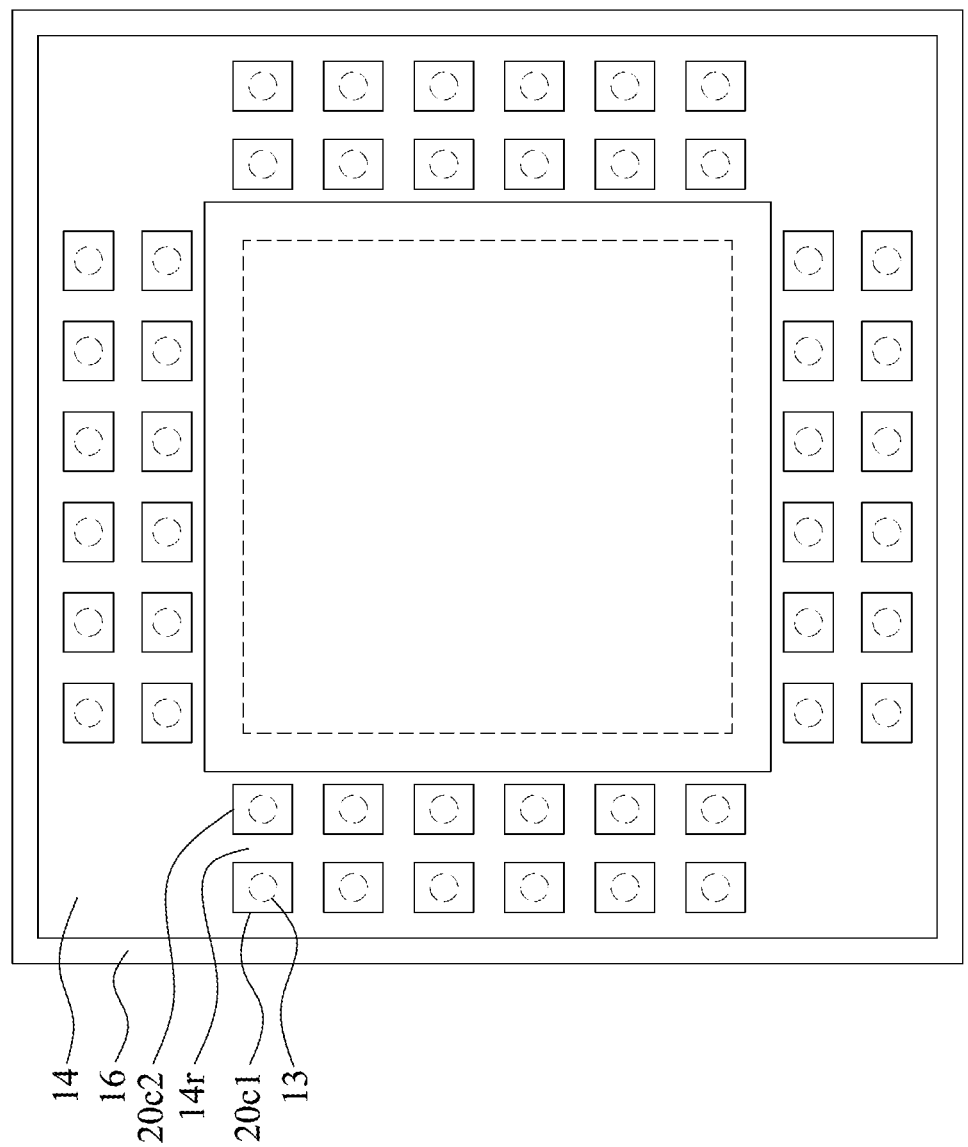
FIG. 2B illustrates a top view of a semiconductor device package in accordance with some embodiments of the present disclosure.

Referring to FIG. 2B, FIG. 2B illustrates a top view of a semiconductor device package in accordance with some embodiments of the present disclosure. In some embodiments, the top view of FIG. 2B may be a top view of the semiconductor package structure 2 in FIG. 2A. The electrical contact 13a2 is omitted in the top view of FIG. 2B for clarity and conciseness.

As shown in FIG. 2B, the conductive pillar 13 is covered by the seed layers (such as the seed layer 20c1 and the seed layer 20c2), and the seed layers are surrounded by the barrier layer 14. In some embodiments, a plurality of seed layers are surrounded by the barrier layer 14 and disposed on a periphery portion of a substrate (such as the substrate 10 in FIG. 2A). For example, the plurality of seed layers overlap the periphery portion of the substrate. For example, the plurality of seed layers are far away from the central portion of the substrate. In some embodiments, the plurality of seed layers is disconnected or separated from each other.

Figure 2C:
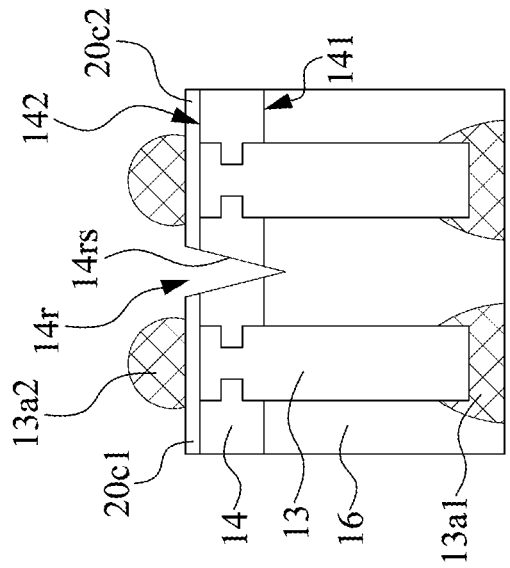
FIG. 2C illustrates an enlarged view of a portion in a dotted box B as shown in FIG. 2A in accordance with some embodiments of the present disclosure.

Referring to FIG. 2C, FIG. 2C illustrates an enlarged view of a portion of the semiconductor device package 2 encircled by a dotted box B as shown in FIG. 2A in accordance with some embodiments of the present disclosure.

The seed layer 20c1 is spaced apart from the seed layer 20c2. The seed layer 20c1 is isolated from the seed layer 20c2 by a notch 14r in the barrier layer 14. The notch 14r has a sidewall 14rs (or a lateral surface). In some embodiments, roughness of the surface 142 of the barrier layer 14 is different from roughness of the sidewall 14rs of the barrier layer 14. In some embodiments, the notch 14r may be formed by half-cutting through the barrier layer 14. For example, the deepest point of the notch 14r is in the barrier layer 14. For example, the encapsulant 16 is not exposed from the notch 14r.

Figure 2D:
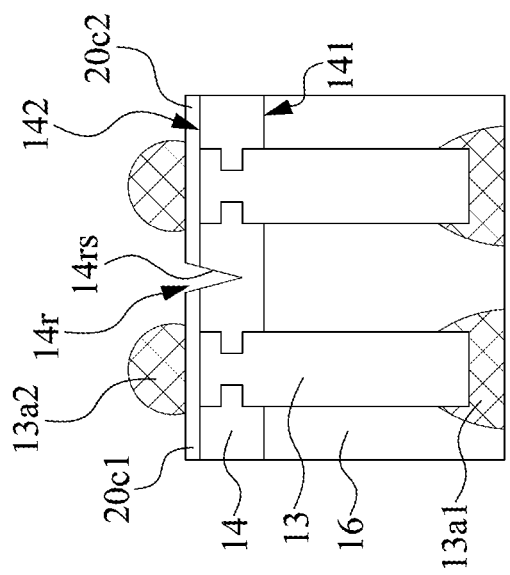
FIG. 2D illustrates an enlarged view of a portion of a semiconductor device package in accordance with some embodiments of the present disclosure.

Referring to FIG. 2D, FIG. 2D illustrates an enlarged view of a portion of a semiconductor device package in accordance with some embodiments of the present disclosure. In some embodiments, the portion in the dotted box B as shown in FIG. 2A can be replaced with the portion illustrated in FIG. 2D. The portion illustrated in FIG. 2D is similar to the portion illustrated in FIG. 2C, and the differences therebetween are described below.

In some embodiments, the notch 14r may be formed by cutting through the barrier layer 14. For example, the deepest point of the notch 14r is in the encapsulant 16. For example, the encapsulant 16 is exposed from the notch 14r.

Figure 3:
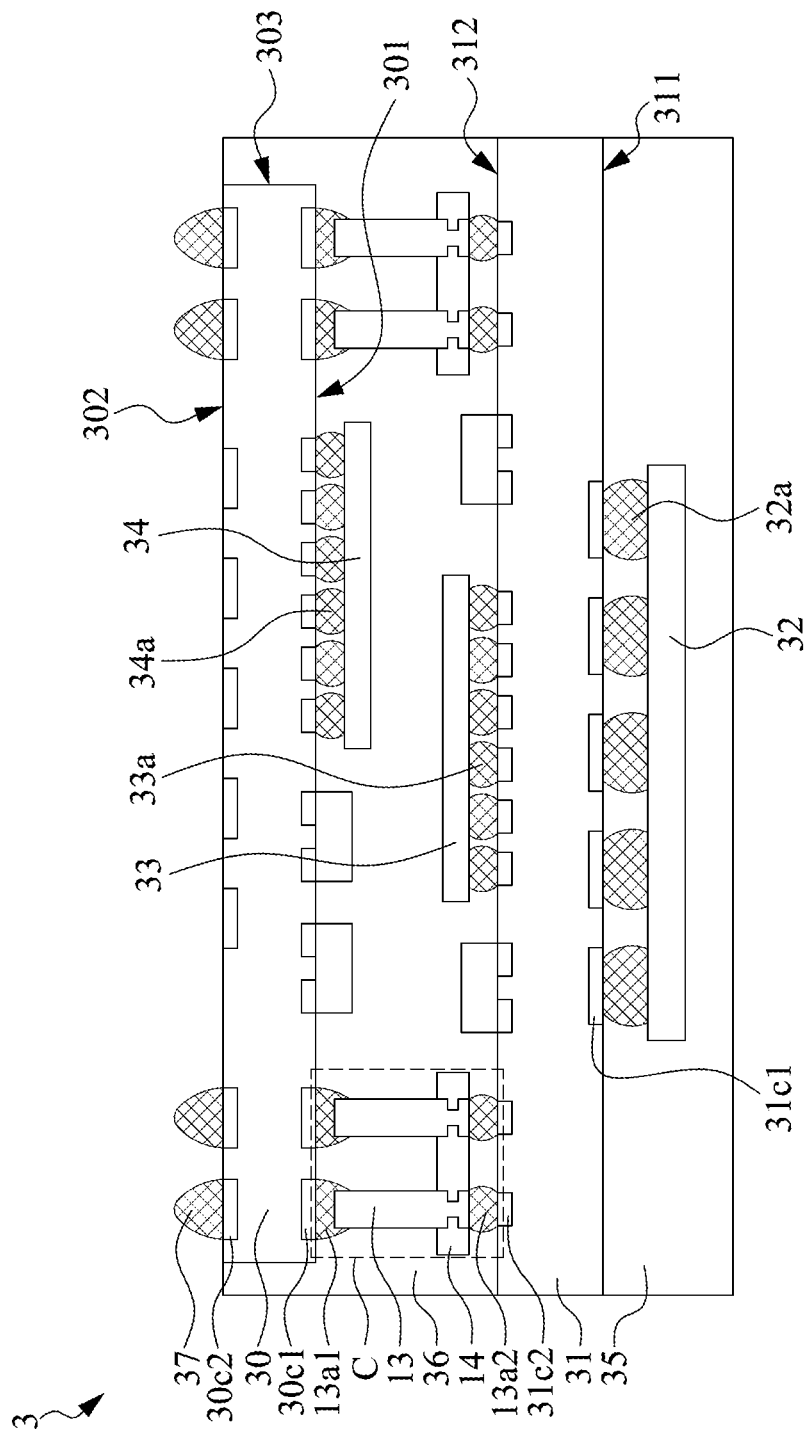
FIG. 3 illustrates a cross-sectional view of a semiconductor device package in accordance with some embodiments of the present disclosure.

FIG. 3 illustrates a cross-sectional view of a semiconductor device package 3 in accordance with some embodiments of the present disclosure. The semiconductor device package 3 includes substrates 30 and 31, electronic components 32, 33, and 34, a conductive pillar 13, a barrier layer 14, encapsulants 35 and 36, and an electrical contact 37.

The same (or similar) components in FIG. 3 and FIG. 1A have the same (or similar) property or configuration, and share the same names.

The detailed descriptions of the components in FIG. 3 can be referred to the detailed descriptions of the components in FIG. 1A, and thus they would not be repeated herein. For example, the substrates 30 and 31 in FIG. 3 may have the same (or similar) property or configuration with the substrate 10 in FIG. 1A.

The substrate 30 has a surface 301, a surface 302 opposite the surface 301, and a surface (or a lateral surface) 303 extended between the surface 301 and the surface 302.

The electronic component 34 is disposed on the surface 301 of the substrate 30 and electrically connected to conductive pads 30c1 provided on the surface 301 through an electrical contact 34a. The electrical contact 37 is disposed on the surface 302 of the substrate 30 and electrically connected to conductive pads 30c2 provided on the surface 302. The encapsulant 36 is disposed on the surface 301 of the substrate 30. The encapsulant 36 covers or encapsulates the electronic component 34. The encapsulant 36 covers or encapsulates the surface 303 of the substrate 30.

The substrate 31 has a surface 311 facing away from the substrate 30 and a surface 312 opposite the surface 311. The substrate 31 also has a surface (or a lateral surface) extended between the surface 311 and the surface 312. Although the surface 303 of the substrate 30 is illustrated as recessed from the lateral surface of the substrate 31, the present disclosure is not limited thereto. For example, the surface 303 of the substrate 30 may be substantially coplanar with the lateral surface of the substrate 31.

The electronic component 32 is disposed on the surface 311 of the substrate 31 and electrically connected to conductive pads 31c1 provided on the surface 311 through an electrical contact 32a. The electronic component 33 is disposed on the surface 312 of the substrate 31 and electrically connected to conductive pads 31c2 provided on the surface 312 through an electrical contact 33a. The encapsulant 35 is disposed on the surface 311 of the substrate 31. The encapsulant 35 covers or encapsulates the electronic component 32.

The conductive pillar 13 is disposed on the surface 301 of the substrate 30 and spaced apart from the electronic component 34. The conductive pillar 13 is electrically connected to the conductive pads 30c1 through an electrical contact 13a1. An electrical contact 13a2 is disposed on a side on the conductive pillar 13 opposite to the electrical contact 13a1 to provide electrical connections between the conductive pillar 13 and the substrate 31.

The barrier layer 14 surrounds a part of a surface (such as a lateral surface) of the conductive pillar 13. The barrier layer 14 is entirely covered or encapsulated in the encapsulant 36.

In some embodiments, a portion in a dotted box C as shown in FIG. 3 can be replaced with the portion illustrated in FIG. 1C, the portion illustrated FIG. 1D, the portion illustrated FIG. 1E, the portion illustrated FIG. 1F, the portion illustrated FIG. 1G, the portion illustrated FIG. 2C, or the portion illustrated FIG. 2D.

FIG. 4A, FIG. 4B, FIG. 4C, FIG. 4D, FIG. 4E, FIG. 4F, FIG. 4G, FIG. 4H, and FIG. 4I, are cross-sectional views of a semiconductor device package at various stages of fabrication, in accordance with some embodiments of the present disclosure. At least some of these figures have been simplified for a better understanding of the aspects of the present disclosure.

Referring to FIG. 4A, a carrier 20 is provided. The carrier 20 may include a conductive core layer with conductive layers (such as a seed layer 20c) provided on both sides. In some embodiments, the seed layer 20c may include, for example, titanium (Ti), Cu, Ni, another metal, or an alloy (such as a titanium-tungsten alloy (TiW)). A photoresist 40 is formed on the seed layer 20c by, for example, coating. One or more openings are formed in the photoresist 40 by, for example, lithographic technique, to expose a portion of the seed layer 20c.

Referring to FIG. 4B, a conductive material 13m1 is disposed in the openings in the photoresist 40 and on the exposed portion of the seed layer 20c. In some embodiments, the conductive material 13m1 may be formed by plating Cu, Ag, Ni, Au, or another metal. In some embodiments, the conductive material 13m1 may be formed by electroless plating Cu, Ni, Pb, or another metal. In some embodiments, the conductive material 13m1 may be formed by printing Cu, Ag, Au, or another metal.

Referring to FIG. 4C, a photoresist 41 is formed on the photoresist 40 by, for example, coating. One or more openings are formed in the photoresist 41 by, for example, lithographic technique, to expose a portion of the conductive material 13m1.

Referring to FIG. 4D, a conductive material 13m2 is disposed in the openings in the photoresist 41 and on the exposed portion of the conductive material 13m1.

Referring to FIG. 4E, the photoresists 40 and 41 are removed by etching, photoresist stripper, or other suitable processes. After the removing operation, the conductive material 13m2 and the conductive material 13m1 remain on the seed layer 20c.

Figure 4F:
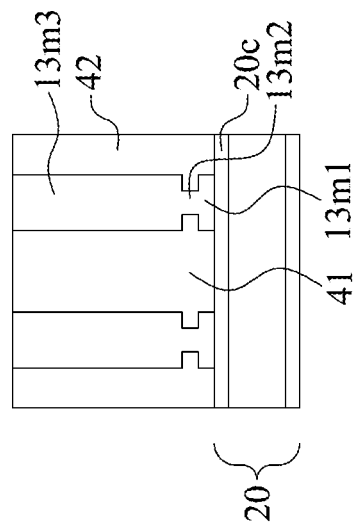
FIG. 4F illustrates one or more stages of a method of manufacturing a semiconductor device package in accordance with some embodiments of the present disclosure.

Referring to FIG. 4F, a photoresist 42 is formed on the seed layer 20c by, for example, coating. One or more openings 42r are formed in the photoresist 42 by, for example, lithographic technique, to expose a portion of the conductive material 13m2.

Figure 4G:
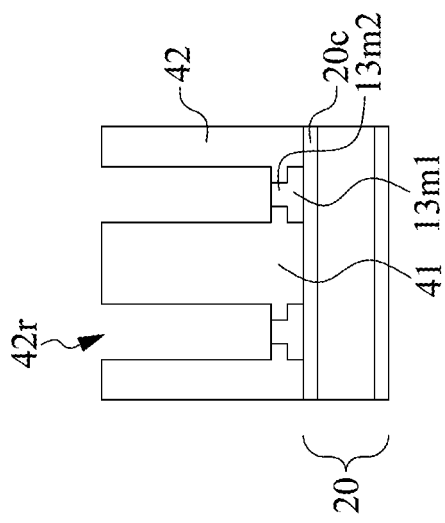
FIG. 4G illustrates one or more stages of a method of manufacturing a semiconductor device package in accordance with some embodiments of the present disclosure.

Referring to FIG. 4G, a conductive material 13m3 is disposed in the openings 42r in the photoresist 42 and on the exposed portion of the conductive material 13m2. The conductive material 13m1, the conductive material 13m2, and the conductive material 13m3 may together form a conductive pillar (such as the conductive pillar 13 in FIG. 2A).

Figure 4H:
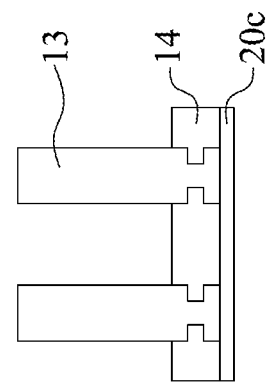
FIG. 4H illustrates one or more stages of a method of manufacturing a semiconductor device package in accordance with some embodiments of the present disclosure.

Referring to FIG. 4H, a portion of the photoresist 42 is removed to expose a portion 133b of the lateral surface (such as the surface 133 in FIG. 1C) of the conductive pillar 13. The remained photoresist 42 may form a barrier layer 14 surrounding a portion 133a of the lateral surface of the conductive pillar 13.

Figure 4I:
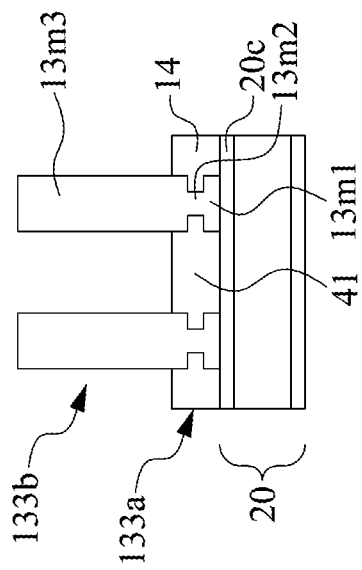
FIG. 4I illustrates one or more stages of a method of manufacturing a semiconductor device package in accordance with some embodiments of the present disclosure.

Referring to FIG. 4I, a portion of the carrier 20 is removed, resulting the structure in FIG. 4I for further processed through the operations in FIG. 5A to FIG. 5F or through the operations in FIG. 6A to FIG. 6E.

FIG. 5A, FIG. 5B, FIG. 5C, FIG. 5D, FIG. 5E, and FIG. 5F, are cross-sectional views of a semiconductor device package at various stages of fabrication, in accordance with some embodiments of the present disclosure. At least some of these figures have been simplified for a better understanding of the aspects of the present disclosure.

Figure 5A:
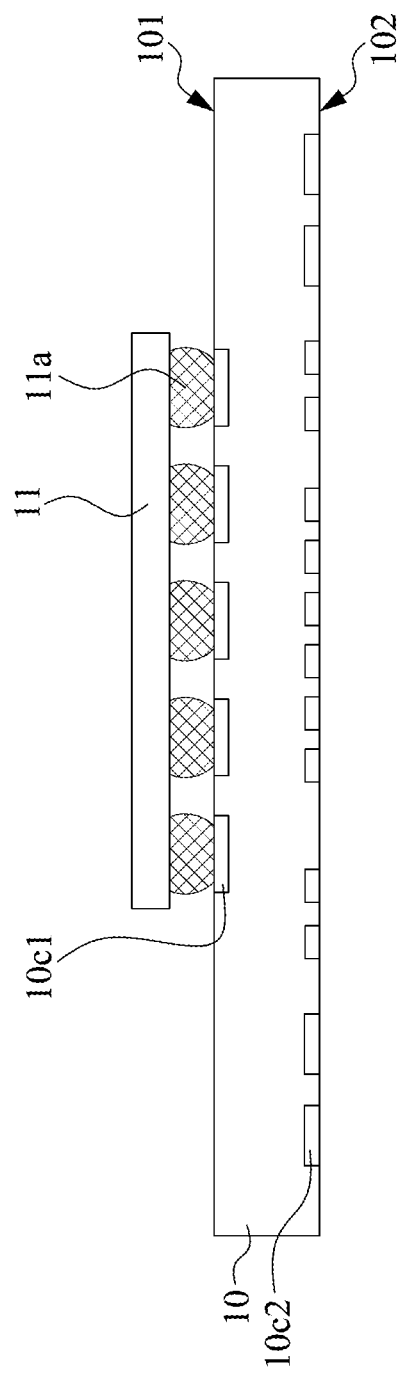
FIG. 5A illustrates one or more stages of a method of manufacturing a semiconductor device package in accordance with some embodiments of the present disclosure.

Referring to FIG. 5A, a substrate 10 is provided. An electronic component 11 is disposed on a surface 101 of the substrate 10 and electrically connected to a conductive pad 10c1 provided on the surface 101 through an electrical contact 11a.

Figure 5B:
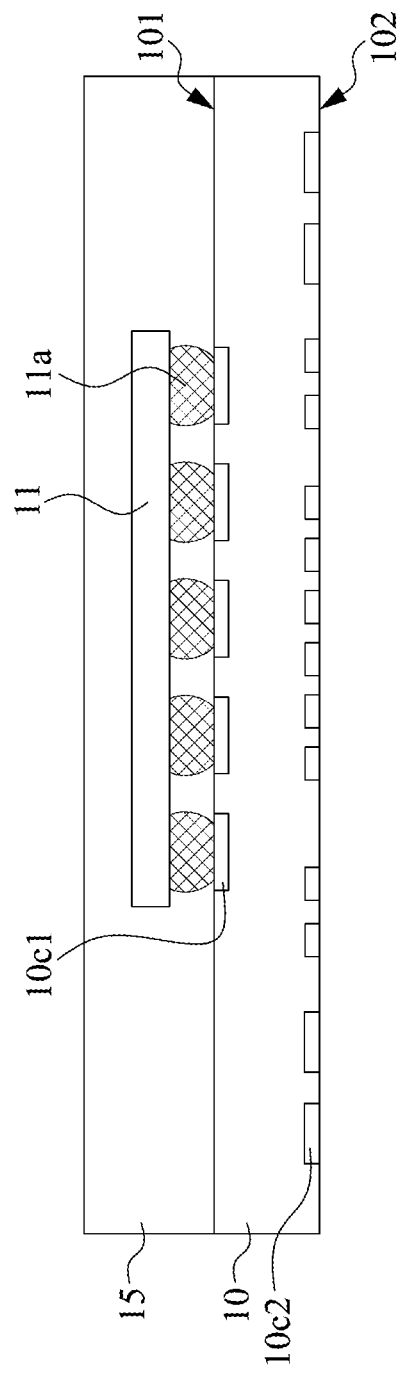
FIG. 5B illustrates one or more stages of a method of manufacturing a semiconductor device package in accordance with some embodiments of the present disclosure.

Referring to FIG. 5B, an encapsulant 15 is disposed on the surface 101 of the substrate 10 to cover or encapsulate the electronic component 11. The encapsulant 15 can be formed by potting technique, dispensing technique, molding technique or other suitable technique(s). The encapsulant 15 may surround the electrical contact 11a.

Figure 5C:
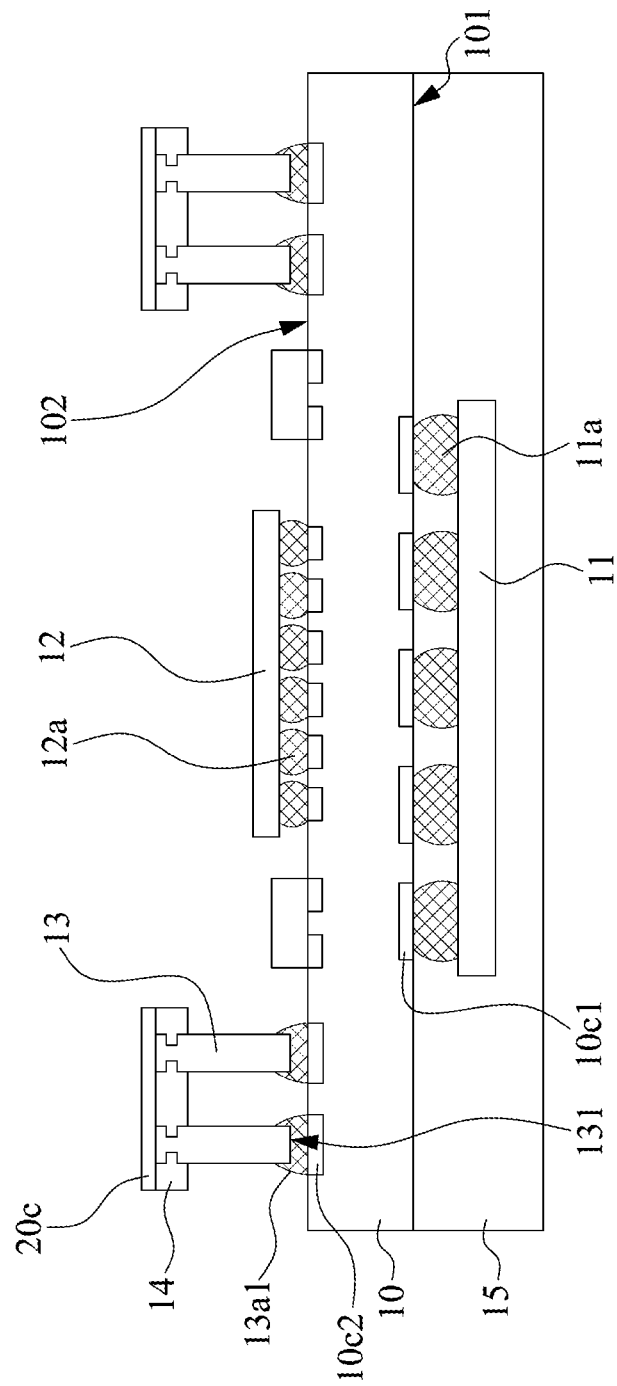
FIG. 5C illustrates one or more stages of a method of manufacturing a semiconductor device package in accordance with some embodiments of the present disclosure.
Figure 5D:
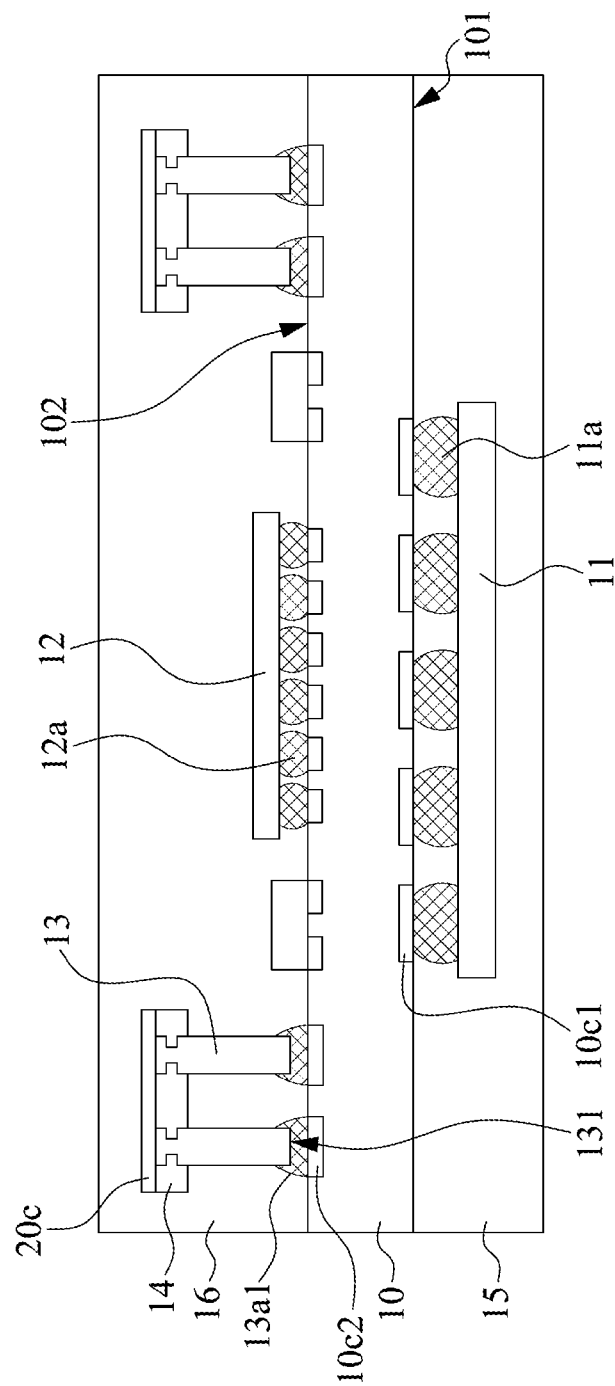
FIG. 5D illustrates one or more stages of a method of manufacturing a semiconductor device package in accordance with some embodiments of the present disclosure.

Referring to FIG. 5C, the structure obtained in the operation of FIG. 5B is flipped. An electrical contact 13a1 is disposed on a conductive pad 10c2 provided on a surface 102 of the substrate 10. The structure obtained in the operation of FIG. 4I (i.e., the conductive pillar 13 and the barrier layer 14) is disposed on the surface 102 of the substrate 10 and electrically connected to the conductive pad 10c2 through the electrical contact 13a1. An electronic component 12 is disposed on the surface 102 of the substrate 10 and electrically connected to the conductive pad 10c2 through an electrical contact 12a.

In some embodiments, after disposing the electronic component 12, the conductive pillar 13, and the barrier layer 14, a pretreatment before molding may be conducted. For example, a clean operation, a baking operation, a surface treatment, other suitable operations or a combination thereof may be conducted. In some embodiments, an oxidation layer (such as the oxidation layer 134 in FIG. 1D) may form on surfaces of the conductive pillar 13 that exposing from the barrier layer 14 and the electrical contact 13a1.

Referring to FIG. 5D, an encapsulant 16 is disposed on the surface 102 of the substrate 10 to cover or encapsulate the electronic component 12. The encapsulant 16 also covers or encapsulates the conductive pillar 13 and the barrier layer 14. In some embodiments, the encapsulant 16 also covers or encapsulates an oxidation layer (such as the oxidation layer 134 in FIG. 1D) on the conductive pillar 13. The encapsulant 16 can be formed by potting technique, dispensing technique, molding technique or other suitable technique(s).

Figure 5E:
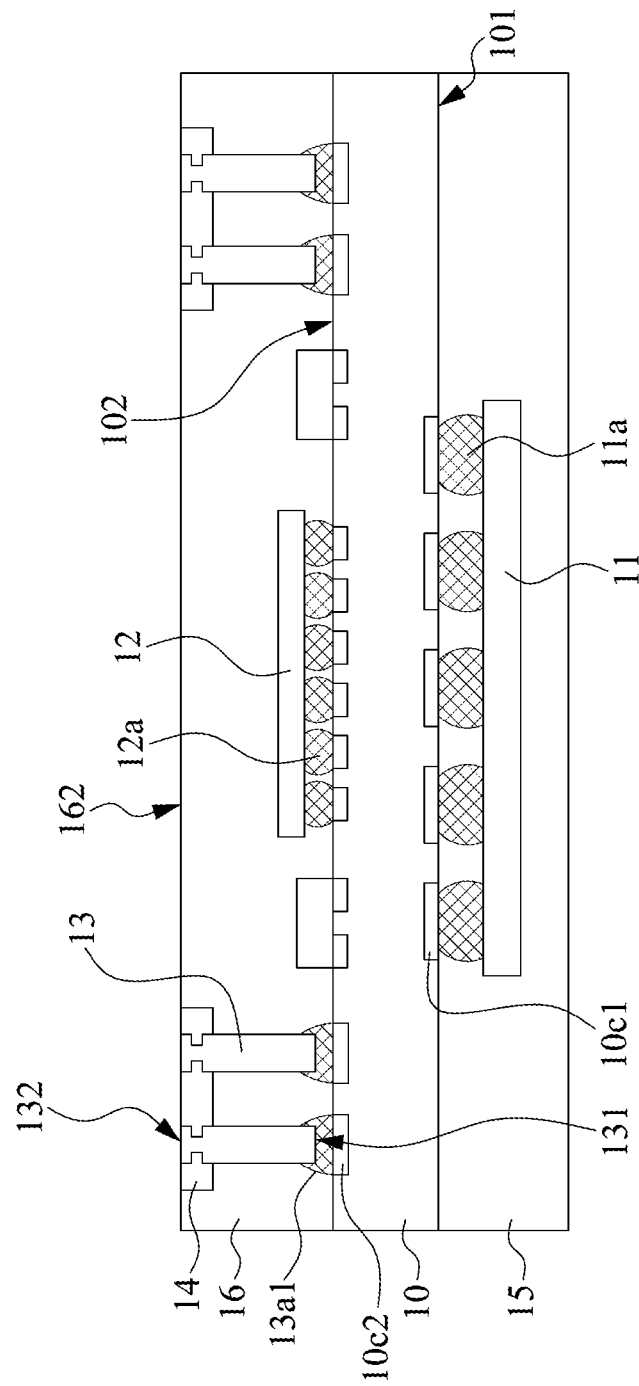
FIG. 5E illustrates one or more stages of a method of manufacturing a semiconductor device package in accordance with some embodiments of the present disclosure.

Referring to FIG. 5E, a planarization operation (such as a chemical-mechanical planarization (CMP) operation) can be conducted to remove the seed layer 20c and a portion of the encapsulant 16. A surface 132 of the conductive pillar 13 may be exposed from the encapsulant 16. In some embodiments, the surface 132 of the conductive pillar 13 may be substantially coplanar with a surface of the barrier layer 14. In some embodiments, the surface 132 of the conductive pillar 13 may be substantially coplanar with a surface of the encapsulant 16.

Figure 5F:
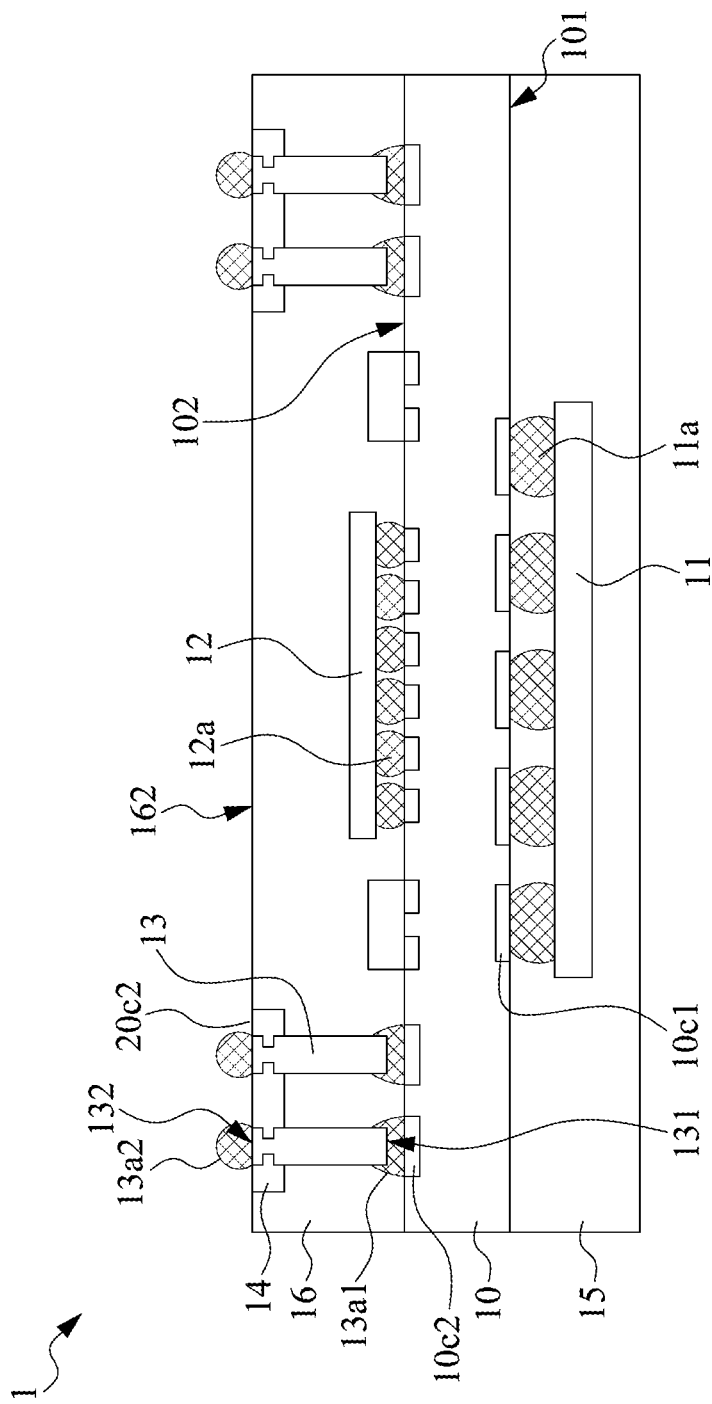
FIG. 5F illustrates one or more stages of a method of manufacturing a semiconductor device package in accordance with some embodiments of the present disclosure.

Referring to FIG. 5F, an electrical contact 13a2 is provided on the surface 132 of the conductive pillar 13. In some embodiments, a reflow operation (such as a reflow soldering) can be conducted to solder the electrical contact 13a2 on the surface 132 of the conductive pillar 13. In some embodiments, the electrical contact 13a1 may flow onto an oxidation layer (such as the oxidation layer 134 in FIG. 1D)

on the conductive pillar 13. In some embodiments, the structure obtained through the operations of FIG. 5A, FIG. 5B, FIG. 5C, FIG. 5D, FIG. 5E, and FIG. 5F may be similar to the semiconductor device package 1 in FIG. 1A.

In some embodiments, the seed layer 20c may remain on the barrier layer 14 to obtain a structure similar to the semiconductor device package 2 in FIG. 2A. For example, the planarization operation in FIG. 5E may be conducted to expose the seed layer 20c. A portion of the seed layer 20c may be removed to isolate a plurality of seed layers (such as the seed layer 20c1 and the seed layer 20c2 in FIG. 2A). In some embodiments, a laser cutting operation or another suitable operation may be used.

FIG. 6A, FIG. 6B, FIG. 6C, FIG. 6D, and FIG. 6E are cross-sectional views of a semiconductor device package at various stages of fabrication, in accordance with some embodiments of the present disclosure. At least some of these figures have been simplified for a better understanding of the aspects of the present disclosure.

Figure 6A:
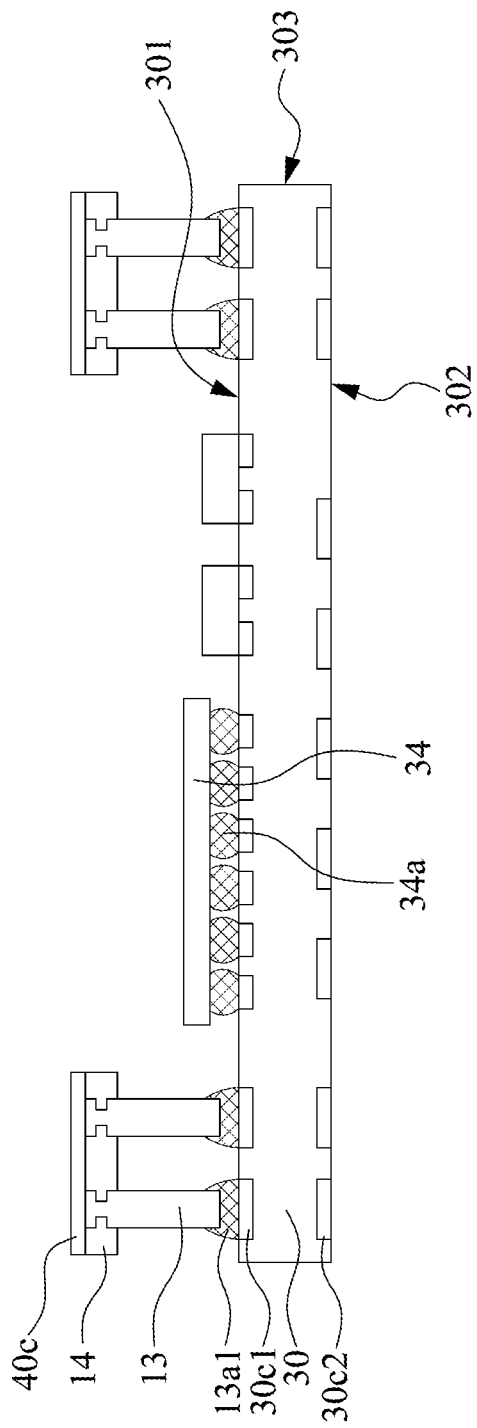
FIG. 6A illustrates one or more stages of a method of manufacturing a semiconductor device package in accordance with some embodiments of the present disclosure.

Referring to FIG. 6A, a substrate 30 is provided. An electronic component 34 is disposed on a surface 301 of the substrate 30 and electrically connected to a conductive pad 30c1 provided on the surface 301 through an electrical contact 34a. An electrical contact 13a1 is provided on the surface 301 of the substrate 30. The structure obtained in the operation of FIG. 4I is disposed on the surface 301 of the substrate 30 and electrically connected to the conductive pad 30c1 through the electrical contact 13a1.

Figure 6B:
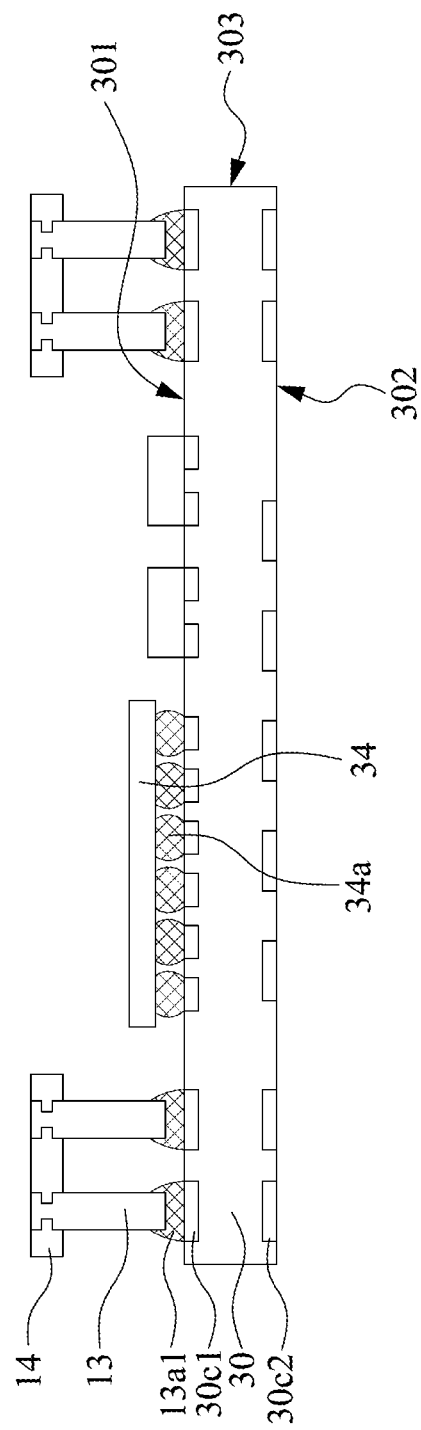
FIG. 6B illustrates one or more stages of a method of manufacturing a semiconductor device package in accordance with some embodiments of the present disclosure.

Referring to FIG. 6B, a planarization operation is conducted to remove the seed layer 20c. A surface 132 of the conductive pillar 13 is exposed from the barrier layer 14.

Figure 6C:
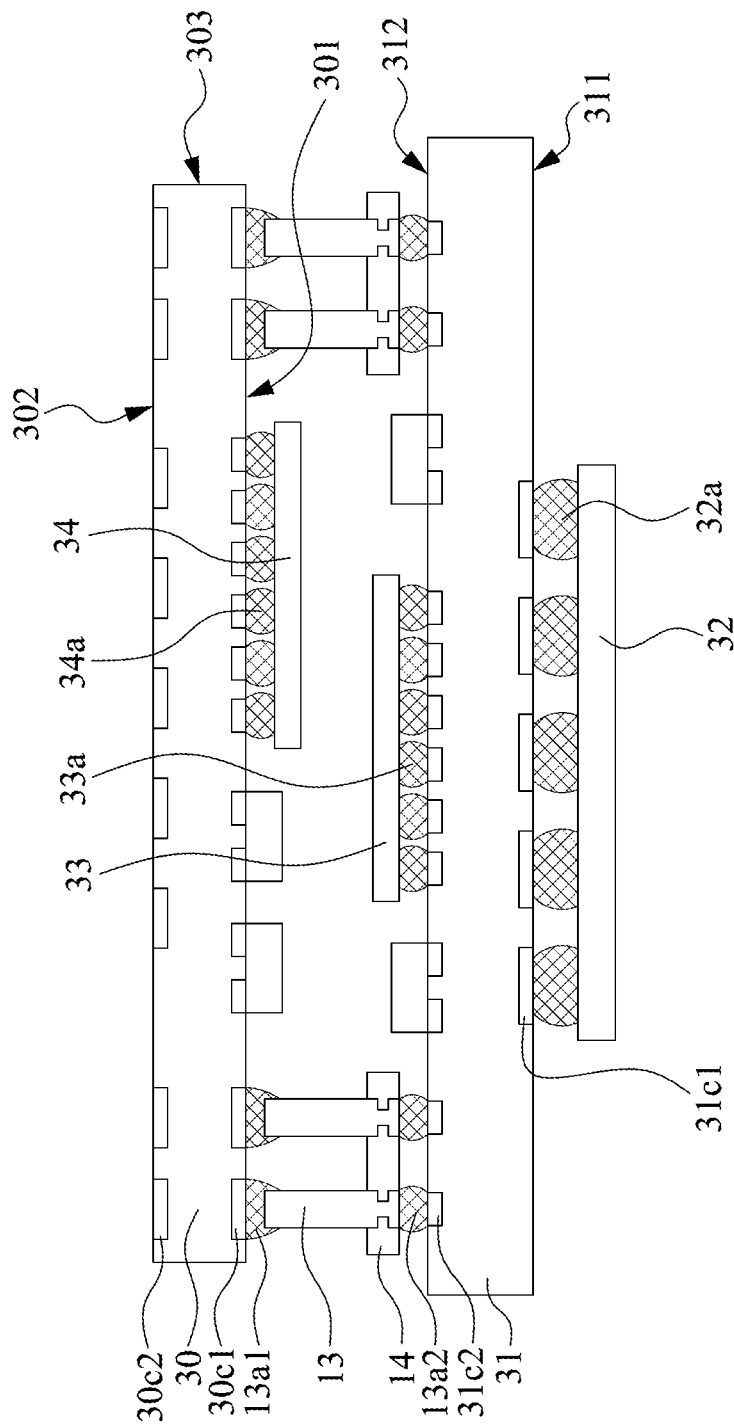
FIG. 6C illustrates one or more stages of a method of manufacturing a semiconductor device package in accordance with some embodiments of the present disclosure.

Referring to FIG. 6C, the structure obtained in the operation of FIG. 6B is flipped and disposed on a substrate 31. The conductive pillar 13 is disposed on a surface 312 of the substrate 31 and electrically connected to a conductive pad 31c2 provided on the surface 312 through an electrical contact 13a2. An electronic component 33 is disposed on the surface 312 of the substrate 31 and electrically connected to the conductive pad 31c2 through an electrical contact 33a. An electronic component 32 is disposed on a surface 311 of the substrate 31 and electrically connected to a conductive pad 31c1 provided on the surface 311 through an electrical contact 32a.

In some embodiments, a pretreatment before molding may be conducted. For example, a clean operation, a baking operation, a surface treatment, other suitable operations or a combination thereof may be conducted. In some embodiments, an oxidation layer (such as the oxidation layer 134 in FIG. 1D) may form on surfaces of the conductive pillar 13 that exposing from the barrier layer 14 and the electrical contact 13a1.

Figure 6D:
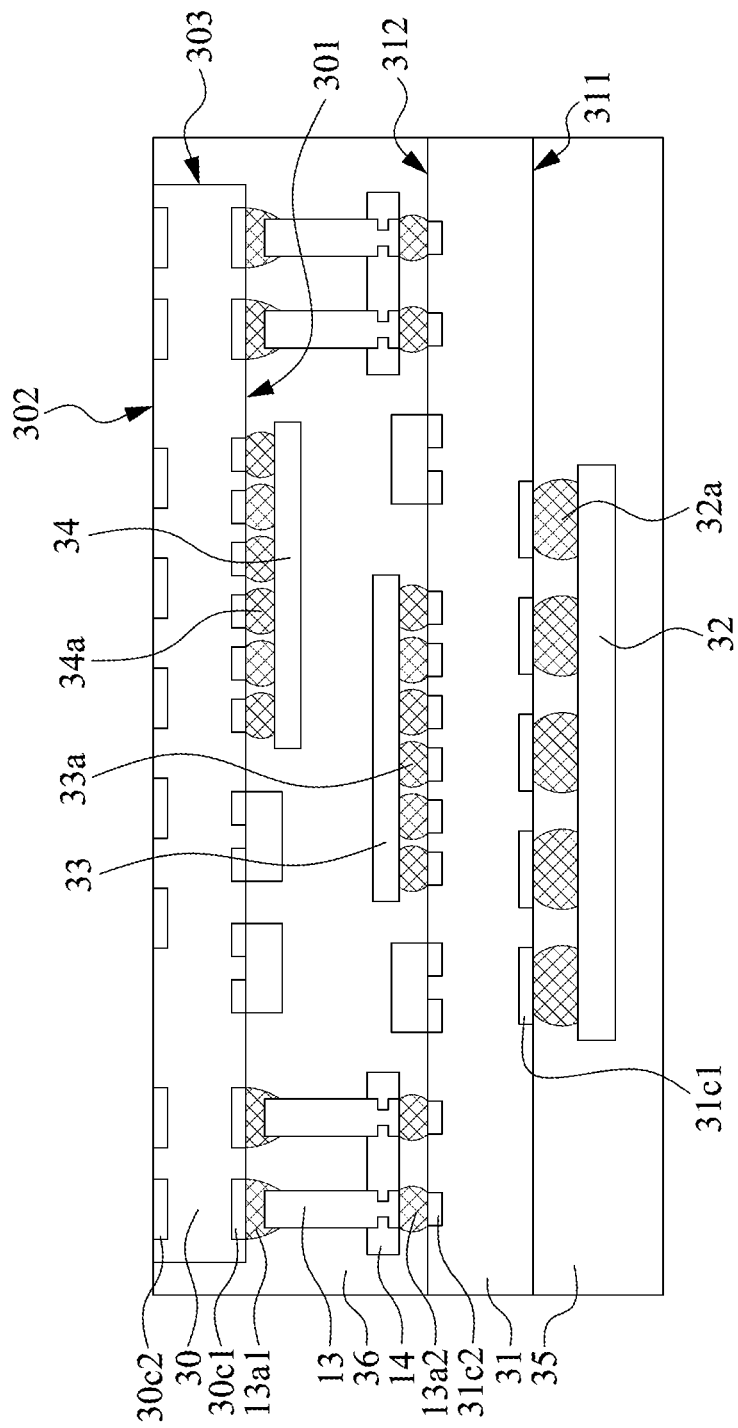
FIG. 6D illustrates one or more stages of a method of manufacturing a semiconductor device package in accordance with some embodiments of the present disclosure.

Referring to FIG. 6D, an encapsulant 36 is disposed on the surface 312 of the substrate 31 to cover or encapsulate the substrate 30. The encapsulant 36 also covers or encapsulates the conductive pillar 13, the barrier layer 14, the electronic component 33, and the electronic component 34. In some embodiments, the encapsulant 36 also covers or encapsulates an oxidation layer (such as the oxidation layer 134 in FIG. 1D) on the conductive pillar 13. An encapsulant 35 is disposed on the surface 311 of the substrate 31 to cover or encapsulate the electronic component 32.

Figure 6E:
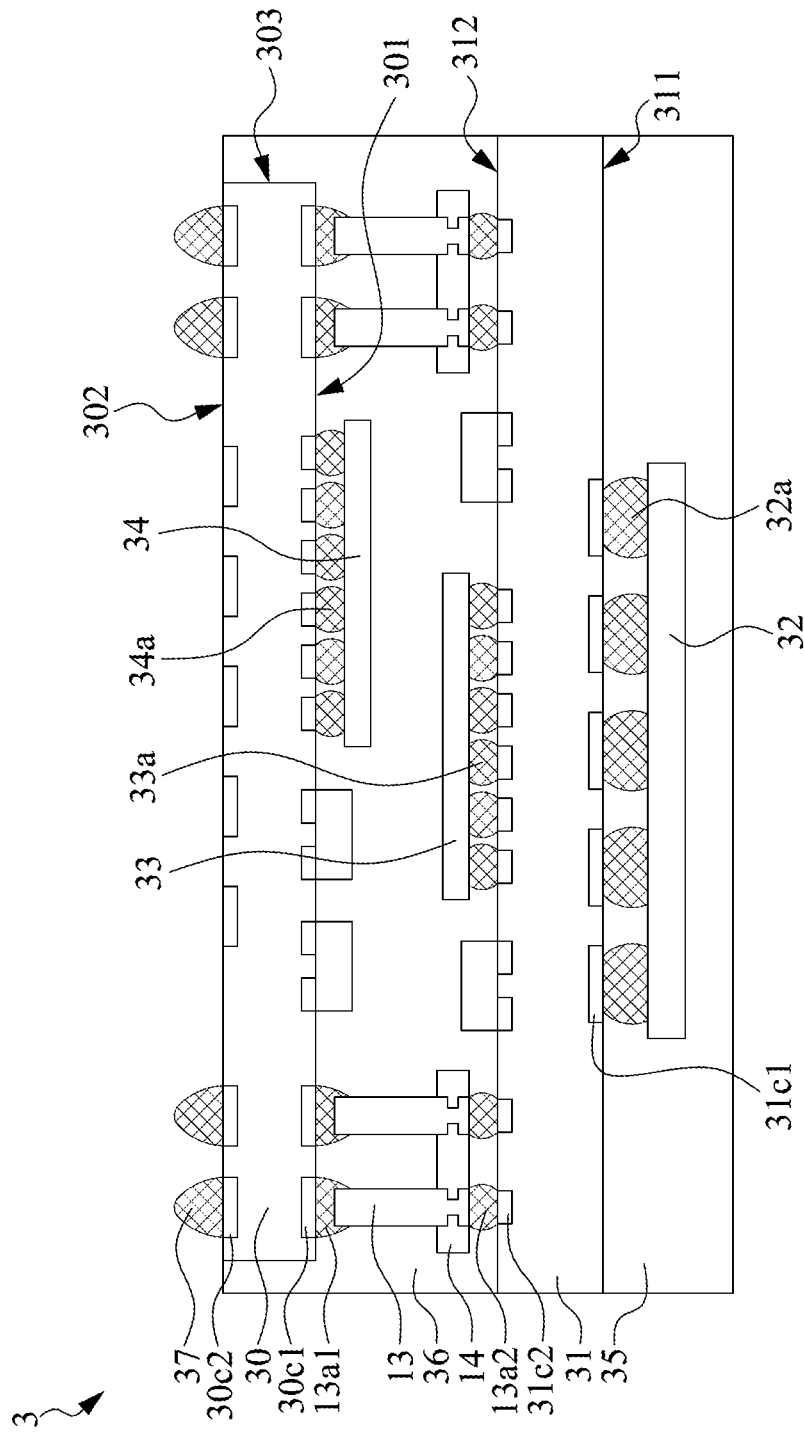
FIG. 6E illustrates one or more stages of a method of manufacturing a semiconductor device package in accordance with some embodiments of the present disclosure.

Referring to FIG. 6E, an electrical contact 37 is provided on the surface 302 of the substrate 30. In some embodiments, a reflow operation (such as a reflow soldering) can be conducted to solder the electrical contact 37 on the surface 302 of the substrate 30. In some embodiments, the electrical contact 13a1 may flow onto an oxidation layer (such as the oxidation layer 134 in FIG. 1D) on the conductive pillar 13. In some embodiments, the structure obtained through the operations of FIG. 6A, FIG. 6B, FIG. 6C, FIG. 6D, and FIG. 6E may be similar to the semiconductor device package 3 in FIG. 3.

In some embodiments, a part of the seed layer 20c may remain on the barrier layer 14. For example, the planarization operation in FIG. 6B may be replaced with a laser cutting operation (or another suitable operation) to remove a portion of the seed layer 20c to isolate a plurality of seed layers (such as the seed layer 20c1 and the seed layer 20c2 in FIG. 2A).

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately," "substantially," "substantial," and "about" are used to describe and account for small variations. When used in conduction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints unless specified otherwise. The term "substantially coplanar" can refer to two surfaces within micrometers (μm) of lying along the same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device package, comprising:
a substrate; and
a structure including:
a barrier layer;
a first conductive pillar having a first portion disposed within the barrier layer and a second portion disposed between a bottom surface of the barrier layer and the substrate;

an encapsulant encapsulating the second portion of the first conductive pillar;

an oxidation layer disposed over a first part of a lateral surface of the second portion of the first conductive pillar, wherein a second part of the lateral surface of the first conductive pillar is exposed from the oxidation layer;

a flowable conductive material in contact with the second part of the lateral surface of the second portion of the first conductive pillar, wherein a first portion of the flowable conductive material is disposed between the first conductive pillar and the oxidation layer, wherein the first portion of the first conductive pillar and the second portion of the first conductive pillar are connected at an interface between the barrier layer and the encapsulant, and a width of the first portion of the first conductive pillar and a width of the second portion of the first conductive pillar are substantially the same from a cross-sectional view.

2. The semiconductor device package of claim 1, further comprising:

a second conductive pillar adjacent to the first conductive pillar and having a third portion disposed within the barrier layer and a fourth portion disposed between the bottom surface of the barrier layer and the substrate, wherein a top surface of the first portion of the first conductive pillar and a top surface of the third portion of the second conductive pillar are exposed from the barrier layer, and wherein a distance between the top surface of the first portion of the first conductive pillar and the top surface of the third portion of the second conductive pillar is substantially the same as a distance between the second portion of the first conductive pillar and the fourth portion of the second conductive pillar.

3. The semiconductor device package of claim 1, wherein a length of the first part of the lateral surface of the second portion of the first conductive pillar is greater than a length of the second part of the lateral surface of the second portion of the first conductive pillar.

4. The semiconductor device package of claim 1, wherein a second portion of the flowable conductive material covers a lateral surface of the oxidation layer.

5. The semiconductor device package of claim 1, wherein the oxidation layer extends from the bottom surface of the barrier layer toward a bottom surface of the second portion of the first conductive pillar.

6. The semiconductor device package of claim 1, further comprising:

an electronic component disposed over the substrate; and the encapsulant disposed over the substrate and covering the electronic component, wherein a part of the encapsulant is disposed between the substrate and the electronic component.

\* \* \* \* \*